(12) United States Patent
Moon et al.

(10) Patent No.: US 10,468,256 B2
(45) Date of Patent: Nov. 5, 2019

(54) METHODS OF FORMING MATERIAL LAYER

(71) Applicant: Samsung Electronics Co., Ltd., Suwon-si, Gyeonggi-do (KR)

(72) Inventors: Sun-min Moon, Yongin-si (KR); Youn-soo Kim, Yongin-si (KR); Han-jin Lim, Seoul (KR); Yong-jae Lee, Incheon (KR); Se-hoon Oh, Hwaseong-si (KR); Hyun-jun Kim, Seoul (KR); Jin-sun Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 382 days.

(21) Appl. No.: 15/482,005

(22) Filed: Apr. 7, 2017

(65) Prior Publication Data

US 2017/0211183 A1    Jul. 27, 2017

Related U.S. Application Data

(62) Division of application No. 15/227,089, filed on Aug. 3, 2016, now Pat. No. 10,103,026.

(30) Foreign Application Priority Data

Aug. 4, 2015    (KR) ................... 10-2015-0110234

(51) Int. Cl.
| | | |
|---|---|---|
| *C23C 16/40* | (2006.01) | |
| *H01L 21/28* | (2006.01) | |
| *H01L 29/40* | (2006.01) | |
| *C23C 16/04* | (2006.01) | |

(Continued)

(52) U.S. Cl.
CPC ...... *H01L 21/28008* (2013.01); *C23C 16/045* (2013.01); *C23C 16/405* (2013.01);
(Continued)

(58) Field of Classification Search
CPC ......... H01L 21/28008; H01L 21/02274; H01L 21/02189; H01L 29/785; H01L 29/517;
(Continued)

(56) References Cited

U.S. PATENT DOCUMENTS

| | | | | |
|---|---|---|---|---|
| 5,225,561 A * | 7/1993 | Kirlin | ..................... | C23C 16/18 546/256 |
| 5,280,012 A * | 1/1994 | Kirlin | ..................... | C23C 16/18 427/126.3 |
| 5,478,610 A * | 12/1995 | Desu | ....................... | C23C 16/40 427/573 |
| 6,623,656 B2 * | 9/2003 | Baum | ....................... | C09D 1/00 252/62.9 PZ |

(Continued)

FOREIGN PATENT DOCUMENTS

| | | |
|---|---|---|
| EP | 2608217 A1 | 6/2013 |
| KR | 2001-0077096 A | 8/2001 |

(Continued)

OTHER PUBLICATIONS

Non-Final Office Action dated Jun. 1, 2017 in corresponding U.S. Appl. No. 15/227,089.

*Primary Examiner* — Rudy Zervigon
(74) *Attorney, Agent, or Firm* — Harness, Dickey & Pierce, P.L.C.

(57) ABSTRACT

A method of forming a material layer includes providing a substrate into a reaction chamber, providing a source material onto a substrate, the source material being a precursor of a metal or semimetal having a ligand, providing an ether-based modifier on the substrate, purging an inside of the reaction chamber, and reacting a reaction material with the source material to form the material layer.

18 Claims, 34 Drawing Sheets

(51) Int. Cl.
<table>
<tr><td>C23C 16/455</td><td>(2006.01)</td></tr>
<tr><td>C23C 16/44</td><td>(2006.01)</td></tr>
<tr><td>H01L 21/02</td><td>(2006.01)</td></tr>
<tr><td>H01L 27/108</td><td>(2006.01)</td></tr>
<tr><td>H01L 27/11582</td><td>(2017.01)</td></tr>
<tr><td>H01L 29/51</td><td>(2006.01)</td></tr>
<tr><td>H01L 29/78</td><td>(2006.01)</td></tr>
<tr><td>H01L 29/66</td><td>(2006.01)</td></tr>
</table>

(52) U.S. Cl.
CPC .... *C23C 16/4408* (2013.01); *C23C 16/45534* (2013.01); *C23C 16/45542* (2013.01); *C23C 16/45544* (2013.01); *C23C 16/45557* (2013.01); *C23C 16/45561* (2013.01); *H01L 21/0228* (2013.01); *H01L 21/02189* (2013.01); *H01L 21/02274* (2013.01); *H01L 21/28194* (2013.01); *H01L 21/28282* (2013.01); *H01L 27/10879* (2013.01); *H01L 27/11582* (2013.01); *H01L 29/401* (2013.01); *H01L 29/517* (2013.01); *H01L 29/785* (2013.01); H01L 27/10852 (2013.01); H01L 29/66795 (2013.01)

(58) Field of Classification Search
CPC ........... H01L 21/0228; H01L 21/28194; H01L 27/10879; H01L 21/28282; H01L 27/11582; H01L 29/401; H01L 29/66795; H01L 27/10852; C23C 16/45542; C23C 16/4408; C23C 16/45544; C23C 16/45557; C23C 16/45561; C23C 16/045; C23C 16/45534; C23C 16/405
USPC ...................................... 118/715; 156/345.33
See application file for complete search history.

(56) References Cited

U.S. PATENT DOCUMENTS

| | | | | |
|---|---|---|---|---|
| 6,784,049 | B2* | 8/2004 | Vaartstra | C23C 16/405 |
| | | | | 438/240 |
| 7,674,401 | B2* | 3/2010 | Maruyama | C23C 24/08 |
| | | | | 118/666 |
| 7,989,361 | B2* | 8/2011 | Seon | H01L 21/316 |
| | | | | 438/781 |
| 8,026,038 | B2* | 9/2011 | Ogihara | C08G 77/56 |
| | | | | 430/270.1 |
| 8,367,561 | B2* | 2/2013 | Maula | C23C 16/403 |
| | | | | 438/240 |
| 8,592,005 | B2* | 11/2013 | Ueda | C23C 16/04 |
| | | | | 427/576 |
| 9,076,647 | B2* | 7/2015 | Chung | H01L 21/02164 |
| 9,583,336 | B1* | 2/2017 | Srinivasan | H01L 21/02197 |
| 10,103,026 | B2* | 10/2018 | Moon | C23C 16/045 |
| 2005/0009266 | A1 | 1/2005 | Vaartstra | |
| 2006/0278166 | A1* | 12/2006 | Yamoto | C23C 16/4481 |
| | | | | 118/726 |
| 2007/0287248 | A1* | 12/2007 | Matsumoto | C23C 16/409 |
| | | | | 438/240 |
| 2008/0072792 | A1* | 3/2008 | Yanagisawa | C23C 16/045 |
| | | | | 106/287.19 |
| 2008/0194088 | A1* | 8/2008 | Srinivasan | C23C 16/405 |
| | | | | 438/584 |
| 2010/0112211 | A1* | 5/2010 | Xu | C07C 211/65 |
| | | | | 427/248.1 |
| 2014/0024200 | A1* | 1/2014 | Kato | H01L 21/02617 |
| | | | | 438/473 |
| 2017/0040172 | A1* | 2/2017 | Moon | C23C 16/045 |
| 2017/0350012 | A1* | 12/2017 | Moon | C23C 16/045 |

FOREIGN PATENT DOCUMENTS

| KR | 2012-0122887 A | 11/2012 |
|---|---|---|
| KR | 10-1284664 B1 | 7/2013 |

* cited by examiner

METHODS OF FORMING MATERIAL LAYER

CROSS-REFERENCE TO RELATED APPLICATION

This application is a divisional of U.S. application Ser. No. 15/227,089, filed on Aug. 3, 2016, which claims priority under 35 U.S.C. § 119 to Korean Patent Application No. 10-2015-0110234, filed on Aug. 4, 2015, in the Korean Intellectual Property Office, the entire contents of each of which are incorporated herein by reference.

BACKGROUND

Field

Example embodiments of the inventive concepts relate to methods of forming a material layer, and more particularly, to methods of forming a material layer, by which a material layer having good step coverage may be stably manufactured despite variations in other process parameters.

Related Art

As semiconductor devices have been increasingly downscaled, it has become more difficult to conformally form thin layers. In particular, with the downscaling of semiconductor devices, aspect ratios of structures in semiconductor devices may greatly increase. Thus, it becomes increasingly difficult for thin layers to maintain high step coverages, and process conditions become more complicated. Accordingly, it is imperatively necessary to develop a method of forming a thin layer having good step coverage under eased conditions.

SUMMARY

Example embodiments of the inventive concepts provide methods of forming a material layer, by which a material layer having good step coverage may be stably manufactured in spite of variations in other process parameters.

Example embodiments of the inventive concepts also provide a method of manufacturing a semiconductor device, by which a semiconductor device including a dielectric layer having good step coverage may be stably manufactured in spite of variations in other process parameters.

According to example embodiments of the inventive concepts, there is provided a method of forming a material layer. The method includes providing a substrate into a reaction chamber, providing a source material onto the substrate, the source material being a precursor of a metal or semimetal having a ligand, providing an ether-based modifier on the substrate, purging an inside of the reaction chamber, and reacting a reaction material with the source material to form the material layer.

The providing a source material may be performed to form a layer of the source material, and the providing an ether-based modifier may be performed before, after, or both before and after the providing a source material. The method may further include purging the inside of the reaction chamber between the providing a source material and the providing an ether-based modifier.

The providing a source material may at least partially temporally overlap with the providing an ether-based modifier.

The providing an ether-based modifier is performed both before the providing a source material and after the providing a source material.

The providing a source material, the providing an ether-based modifier, the purging of an inside of the reaction chamber, and the providing a reaction material may be repeated at least twice until the material layer is formed to a desired thickness.

The reaction material may be an oxidizer or a nitrifier. The oxidizer may include $O_3$, $H_2O$, $O_2$, $NO_2$, NO, $N_2O$, $H_2O$, alcohol, a metal alkoxide, plasma $O_2$, remote plasma $O_2$, plasma $N_2O$, plasma $H_2O$, or a combination thereof. The nitrifier may include $N_2$, $NH_3$, hydrazine ($N_2H_4$), plasma $N_2$, remote plasma $N_2$, or a combination thereof.

The providing a reaction material may include providing the reaction material to form only one layer of the material layer. The providing an ether-based modifier may at least partially overlap with the providing a reaction material.

The source material may include a first source material and a second source material different from the first source material.

The ether-based modifier may be indicated by R—O—R', and each of R and R' may be independently selected from the group consisting of C1-C10 alkyl, C1-C10 alkenyl, C6-C12 aryl, C6-C12 arylalkyl, C6-C12 alkylaryl, C3-C12 cycloalkyl, C3-C12 cycloalkenyl, C3-C12 cycloalkynyl, and C3-C12 heterocycloalkyl containing at least one of N and O in rings.

The metal or semimetal of the precursor may include at least one selected from the group consisting of zirconium (Zr), lithium (Li), beryllium Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), Francium (Fr), radium (Ra), actinium (Ac), and silicon (Si).

According to example embodiments of the inventive concepts, there is provided a method of manufacturing a semiconductor device. The method includes forming a lower electrode to be electrically connected to an active region of a semiconductor substrate, forming a dielectric layer on an entire exposed surface of the lower electrode, and forming an upper electrode on the dielectric layer. The forming a dielectric layer may include supplying a source material, supplying an ether-based modifier, and supplying a reaction material.

According to example embodiments, a method of forming a material layer includes providing a semiconductor layer within a reaction chamber; forming a monolayer using a first reaction precursor and an ether-based modifier; purging an inside of the reaction chamber; and forming the material layer by reacting a second reaction precursor with the monolayer.

The forming a monolayer may include performing atomic layer deposition of the first reaction precursor onto the semiconductor layer during a first time period. The method may further comprise providing the ether-based modifier onto the semiconductor layer during a second time period.

The reacting a second reaction precursor may include providing the second reaction precursor onto the monolayer during a third time period. The second time period may occur (i) after the first time period, and (ii) either before, or during, the third time period. Alternatively, the second time period may occur (i) before the third time period, and (ii) either before, or during, the first time period.

The ether-based modifier may have a polarizability higher than an alcohol-based modifier selected from a methanol-based modifier, an ethanol-based modifier, a propanol-based modifier, a butanol-based modifier, a formic acid-based modifier, an acetic acid-based modifier, a propanoic acid-based modifier, a butanoic-acid based modifier, a pentanoic-acid based modifier, a phenol-based modifier and a benzoic-acid based modifier.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
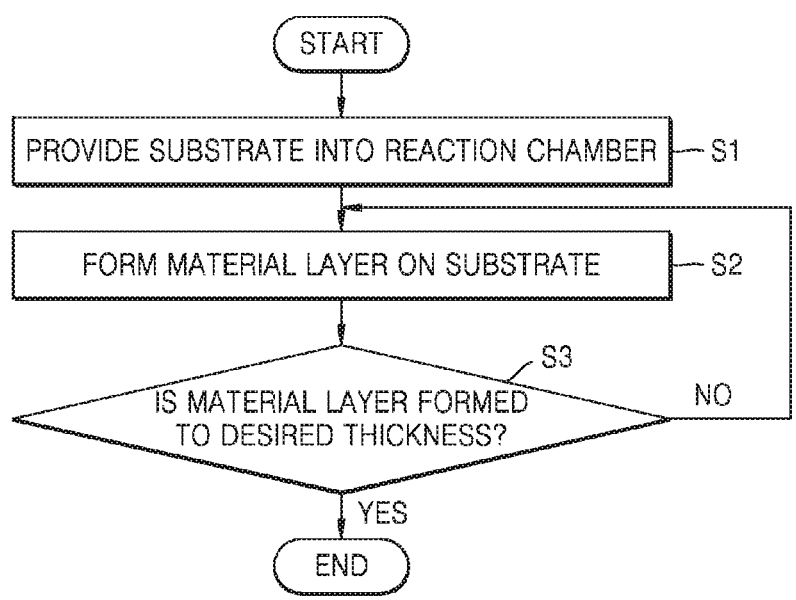
FIG. 1 is a flowchart of a method of forming a material layer according to some example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

FIG. 1 is a flowchart of a method of forming a material layer according to some example embodiments.

Referring to FIG. 1, a substrate may be provided into a reaction chamber (S1). The substrate may include a semiconductor substrate including a semiconductor element (e.g., silicon (Si) or germanium (Ge)) or a compound semiconductor (e.g., silicon carbide (SiC), gallium arsenide (GaAs), indium arsenide (InAs), or indium phosphide (InP)). In some example embodiments, the substrate may include a structure including a semiconductor substrate, at least one insulating layer formed on the semiconductor substrate, and/or at least one conductive region. The conductive region may include, for example, a doped well, a doped structure, and/or a metal-containing conductive layer. Also, the substrate may have one of various device isolation structures, such as a shallow trench isolation (STI) structure.

A material layer may be formed on the substrate loaded into the reaction chamber (S2). The material layer may include a metal oxide, a metal nitride, a semimetal oxide, and/or a semimetal nitride.

More specifically, the metal or semimetal may be, for example, at least one selected from the group consisting of zirconium (Zr), lithium (Li), beryllium Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), Francium (Fr), radium (Ra), actinium (Ac), and silicon (Si).

In particular, the material layer may be a Zr oxide layer, an Al oxide layer, a Hf oxide layer, a La oxide layer, a Si oxide layer, a Ta oxide layer, a Nb oxide layer, a Zr nitride layer, an Al nitride layer, a Hf nitride layer, a La nitride layer, a Si nitride layer, a Ta nitride layer, a Nb nitride layer, or a combination thereof. Alternatively, the material layer may be a composite oxide thin layer or composite nitride thin layer including at least two kinds of central atoms selected from zinc, aluminum, hafnium, lanthanum, silicon, tantalum, and niobium.

The material layer manufactured by a method of forming a material layer according to example embodiments may be used for various purposes. For example, the material layer manufactured by the method of forming the material layer according to the example embodiments may be used for a dielectric layer included in a capacitor of a semiconductor memory device, a gate dielectric layer of a transistor, a conductive barrier layer used for an interconnection, a resistive layer, a magnetic layer, a liquid-crystal (LC) barrier metal layer, a member for a thin-film solar cell, a member for semiconductor equipment, a nanostructure, a hydrogen storage alloy, and a microelectromechanical (MEMS) actuator, but example embodiments of the inventive concepts are not limited thereto.

Thereafter, it may be determined whether the material layer is formed to a desired thickness (S3). When the material layer is formed to a thickness smaller than the desired thickness, an operation S2 of forming the material layer may be repeated. When the material layer is formed to a thickness equal to or greater than the desired thickness, an additional operation of forming a material layer may be interrupted.

Figure 2:
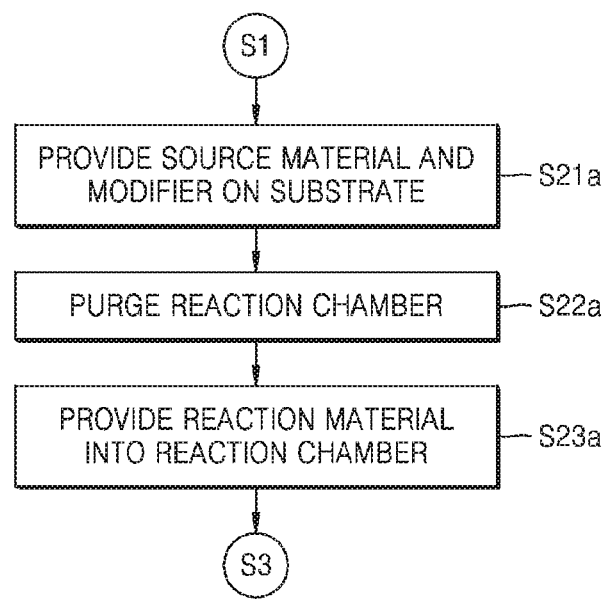
FIG. 2 is a detailed flowchart of an operation of forming a material layer on the substrate according to some example embodiments.

FIG. 2 is a detailed flowchart of an operation of forming the material layer on the substrate, according to some example embodiments.

Referring to FIG. 2, a source material and a modifier may be provided on a substrate (S21a).

The source material may be a precursor material of the material layer to be deposited. The source material may be an arbitrary material that may be denoted by MLn. Here, M denotes a central atom of the source material, and L denotes a ligand bonded to M, that is the central atom of the source material. Also, n denotes a number determined by the central atom M and the ligand L and is, for example, an integer ranged from 2 to 6. Since the central atom M is metal or a semimetal as described above, additional descriptions thereof are omitted.

In a method of forming a thin layer according to some example embodiments, compounds, which may be used as the source material, and organic coordination compounds, which may be included as ligands in the source material, will be described in detail later.

The modifier may be an ether-based material that may be indicated by R—O—W. Here, each of R and R' may be independently selected from the group consisting of C1-C10 alkyl, C1-C10 alkenyl, C6-C12 aryl, C6-C12 arylalkyl, C6-C12 alkylaryl, C3-C12 cycloalkyl, C3-C12 cycloalkenyl, C3-C12 cycloalkynyl, and C3-C12 heterocycloalkyl containing at least one of N and O in rings. Optionally, R and R' are connected to each other to form a ring.

According to some example embodiments, the modifier may be an ether-based modifier having a polarizability higher than an alcohol-based modifier selected from a methanol-based modifier, an ethanol-based modifier, a propanol-based modifier, a butanol-based modifier, a formic acid-based modifier, an acetic acid-based modifier, a propanoic acid-based modifier, a butanoic-acid based modifier, a pentanoic-acid based modifier, a phenol-based modifier and a benzoic-acid based modifier.

When the source material and the modifier are supplied onto the substrate in the reaction chamber, a layer of the source material may be formed on the substrate. Also, the source material may be excessively physisorbed on portions of the substrate to form two or more layers of the source material.

Thereafter, after the source material and the modifier are provided on the substrate, the reaction chamber may be purged with a purge gas (S22a). The source material and the modifier that are excessively adsorbed on the substrate may be removed due to the purge process, and the layer of the source material may uniformly form one monolayer on the substrate.

For example, the purge gas may be an inert gas, such as argon (Ar), helium (He), or neon (Ne), and/or a gas having very low activity, such as nitrogen ($N_2$).

Thereafter, a reaction material may be supplied into the reaction chamber (S23a). The reaction material may include a material (e.g., an oxidizer or a nitrifier) that may be reacted with the source material to form a material layer.

The oxidizer may include, for example, $O_3$, $H_2O$, $O_2$, $NO_2$, NO, $N_2O$, $H_2O$, alcohol, a metal alkoxide, plasma $O_2$, remote plasma $O_2$, plasma $N_2O$, plasma $H_2O$, or a combination thereof. The nitrifier may include, for example, $N_2$, $NH_3$, hydrazine ($N_2H_4$), plasma $N_2$, remote plasma $N_2$, or a combination thereof.

The material layer may be grown in an apparatus capable of performing an atomic layer deposition (ALD) process or a chemical vapor deposition (CVD) process. The semiconductor apparatus may include the reaction chamber. The reaction chamber may be a chamber into which a substrate is loaded to perform an ALD process or a CVD process.

Figure 3:
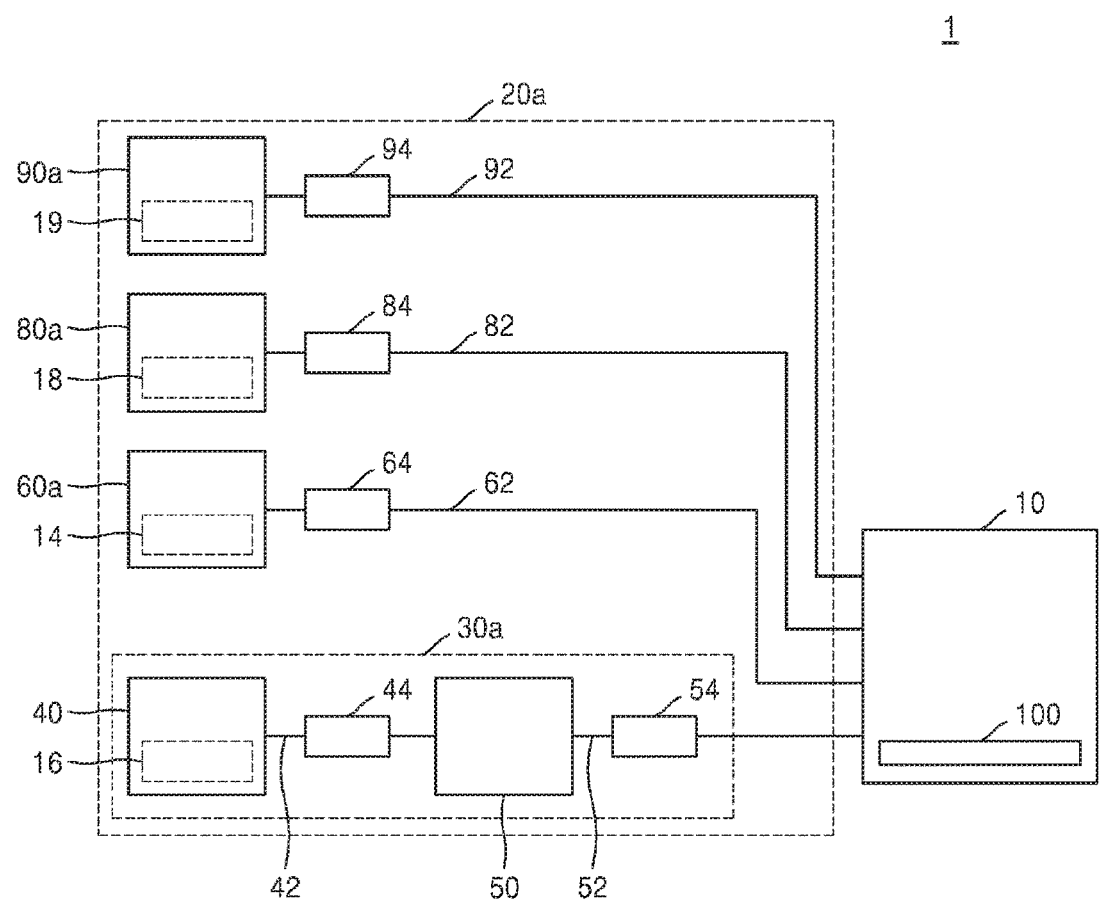
FIG. 3 is a schematic diagram of a semiconductor device manufacturing apparatus configured to form a material layer according to some example embodiments.

FIG. 3 is a schematic diagram of a semiconductor apparatus configured to perform a method of forming a material layer according to some example embodiments.

Referring to FIG. 3, a semiconductor apparatus 1 may include a process material supply system 20a capable of independently supplying the modifier 14, the source material 16, a purge gas 19, and a reaction material 18 into a reaction chamber 10. The process material supply system 20a may be configured to independently supply the modifier 14, the source material 16, the purge gas 19, and the reaction material 18 into the reaction chamber 10 in pulse for different time periods. Alternatively, the process material supply system 20a may be configured to supply at least two of the modifier 14, the source material 16, the purge gas 19, and the reaction material 18 into the reaction chamber 10 at the same time. The reaction chamber 10 may be a chamber into and from which a substrate 100 may be loaded and unloaded.

The process material supply system 20a may include a source material supply apparatus 30a, a modifier supply apparatus 60a, a purge gas supply apparatus 90a, and a reaction material supply apparatus 80a. The source material supply apparatus 30a may be an apparatus configured to supply the source material 16 into the reaction chamber 10.

The source material supply apparatus 30a may include a source material storage container 40 and a vaporizer 50. The source material storage container 40 and the vaporizer 50 may be connected to each other by a conduit 42, and the conduit 42 may include a flow rate control device 44. The vaporizer 50 and the process chamber 10 may be connected to each other by a conduit 52, and the conduit 52 may include a flow rate control device 54.

The source material 16 in the source material storage container 40 may be transported to the vaporizer 50 and vaporized in the vaporizer 50. Also, the source material vaporized by the vaporizer 50 may be supplied to the reaction chamber 10.

The modifier supply apparatus 60a may be an apparatus configured to supply the modifier 14 into the reaction chamber 10. The modifier 14 may be stored in the modifier supply apparatus 60a and supplied from the modifier supply apparatus 60a into the reaction chamber 10 through a conduit 62.

The modifier supply apparatus 60a may be connected to the reaction chamber 10 by the conduit 62, and the conduit 62 may include a flow rate control device 64 capable of controlling a flow rate of the modifier 14.

The reaction material supply apparatus 80a may be an apparatus configured to supply the reaction material 18 into the reaction chamber 10. The reaction material 18 may be stored in the reaction material supply apparatus 80a and supplied from the reaction material supply apparatus 80a into the reaction chamber 10 through a conduit 82.

The reaction material supply apparatus 80a may be connected to the reaction chamber 10 by the conduit 82, and the conduit 82 may include a flow rate control device 84 capable of controlling a flow rate of the reaction material 18.

The purge gas supply apparatus 90a may be an apparatus configured to supply the purge gas 19 into the reaction chamber 10. The purge gas 19 may be stored in the purge gas supply apparatus 90a and supplied from the purge gas supply apparatus 90a into the reaction chamber 10 through a conduit 92.

The purge gas supply apparatus 90a may be connected to the reaction chamber 10 by the conduit 92, and the conduit 92 may include a flow rate control device 94 capable of controlling a flow rate of the purge gas 19.

The conduits 42, 52, 62, 82, and 92 may be conduits through which fluids may flow, and the flow rate control devices 44, 54, 64, 84, and 94 may include valve systems capable of controlling the flows of the fluids.

The process material supply system 20a may be a system capable of independently supplying the modifier 14, the source material 16, the purge gas 19, and the reaction material 18 into the reaction chamber 10. The process material supply system 20a may be configured to supply the modifier 14, the source material 16, the purge gas 19, and the reaction material 18 into the reaction chamber 10 for different time durations or at the same time.

The source material may be a material indicated by MLn as described above. The source material may be a material that may be indicated by M(La)n(Lb)m. Here, La may be a first ligand combined with the central atom M, and Lb may be a second ligand that is combined with the central atom M and different from the first ligand. Here, n may be a number that is determined by the central atom M and the ligand La, and m may be a number that is determined by the central atom M and the ligand Lb.

When the central atom M is zirconium (Zr), the source material may be, for example, at least one selected from the group consisting of (cyclopentadienyl)tris(dimethylamino) zirconium ($CpZr(NMe_2)_3$), tetrakis-ethylmethylamido-zirconium (TEMAZ), tetrakis-diethylamido-zirconium (TDEAZ), tetrakis-dimethylamido-zirconium (TDMAZ), tetrakis-ethyldimethylamido-zirconium, tetrakis-diethylmethylamido-zirconium, tetrakis-triethylamido-zirconium, tetrakis-triethylamido-zirconium, bis-diisopropylamido-bis-dimethylamido-zirconium, bis-di-t-butylamido-bis-dimethylamido-zirconium, bis-ethylmethylamido-bis-diisopropylamido-zirconium, bis-diethylamido-bis-diisopropylamido-zirconium, tris-diisopropylamido-dimethylamido-zirconium, zirconium t-butoxide ($Zr(OtBu)_4$, abbreviated as ZTB), tetrakis(1-methoxy-2-methyl-2-propoxy) hafnium ($Zr(mmp)_4$), tetrakis(1-methoxy-2-methyl-2-propoxy) zirconium ($Zr(mmp)_4$), zirconium tetrachloride ($ZrCl_4$), $ZrCp_2Me_2$, $Zr(tBuCp)_2Me_2$, $Zr(N(iProp)_2)_4$, and tris-diethylamido-diisopropylamido-zirconium, but is not limited thereto.

When the central atom M is aluminum (Al), the source material may be, for example, at least one selected from the group consisting of trimethyl aluminum (TMA), triethyl aluminum (TEA), 1-methylpyrrolidine alane (MPA), dimethylethylamine alane (DMEAA), dimethyl aluminum hydride (DMAH), and trimethylaminealane borane (TMAAB), but is not limited thereto.

When the central atom M is titanium (Ti), the source material may be, for example, at least one selected from the group consisting of titanium tetrakis(isopropoxide) ($Ti(O-iProp)_4$), a titanium halide, cyclopentadienyl titanium, titanium bis(isopropoxide)bis(2,2,6,6-tetramethyl-3,5-heptanedionate) ($Ti(O-iProp)_2(thd)_2$), titanium bis(4-(2-methylethoxy)imino-2-pentanoate)($Ti(2meip)_2$), titanium bis[4-(ethoxy)imino-2-pentanoate]($Ti(eip)_2$), and titanium bis[2,2-dimethyl-5-(2-methylethoxy)imino-3-heptanoate] ($Ti(22dm2meih)_2$), but is not limited thereto.

When the central atom M is hafnium (Hf), the source material may be, for example, at least one selected from the group consisting of hafnium t-butoxide ($Hf(OtBu)_4$, abbreviated as HTB), tetrakis(diethylamido)hafnium, ($Hf(NEt_2)_4$, abbreviated as TDEAH), tetrakis(ethylmethylamido)hafnium, ($Hf(NEtMe)_4$, abbreviated as TEMAH), and tetrakis (dimethylamido)hafnium ($Hf(NMe_2)_4$, abbreviated as TDMAH), but is not limited thereto.

As described above, the modifier may be a material denoted by R—O—R'. For example, the modifier may include at least one selected from the group consisting of dimethylether, diethylether, methylethylether, propylether, methylpropylether, isopropylether, methylisopropylether, dichloroethyl ether, di-n-butyl ether, isoamyl ether, methylphenyl ether, di-n-propylether, diisopropylether, di-sec-butylether, diphenylether, ethylbutylether, butylvinylether, anisole, ethylphenylether, ethyleneglycol dimethylether, ethyleneglycol diethylether, ethyleneglycol dibutylether, diethyleneglycol dimethylether, diethyleneglycol diethylether, furan, tetrahydrofuran, α-methoxytetrahydrofuran, pyran, tetrahydropyran, dioxane, ethyleneglycol monomethylether, and ethyleneglycol mono ethylether, but is not limited thereto.

A kind of source material that may be used in a method of forming a material layer according to example embodiments is not limited to the above-described examples. For example, the source material 16 that may be used in operation S21a of FIG. 2 may include a compound of any one of a metal and a semimetal and at least one organic coordination compound selected from the group consisting of an alcohol compound, a glycol compound, a β-diketone compound, a cyclopentadiene compound, and an organic amine compound.

An organic amine compound that may be used as the organic coordination compound of the source material 16 used in operation S21a of FIG. 2 may be, for example, methylamine, ethylamine, propylamine, isopropylamine, dimethylamine, diethylamine, dipropylamine, diisopropylamine, ehtylmethylamine, propylmethylamine, or isopropylmethylamine, but example embodiments of the inventive concepts are not limited thereto.

An alcohol compound that may be used as the organic coordination compound of the source material 16 used in operation S21a of FIG. 2 may be, for example, alkylalcohols such as methanol, ethanol, propanol, isopropyl alcohol, butanol, sec-butyl alcohol, isobutyl alcohol, tert-butyl alcohol, pentyl alcohol, isopentyl alcohol, tert-pentyl alcohol; ether-alcohols such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-propoxy-1,1-diethylethanol, 2-butoxy-1,1-diethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylaminoalcohol, but example embodiments of the inventive concepts are not limited thereto.

A glycol compound that may be used as the organic coordination compound of the source material 16 used in operation S21a of FIG. 2 may be, for example, 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol, but example embodiments of the inventive concepts are not limited thereto.

A β-diketone compound that may be used as the organic coordination compound of the source material 16 used in operation S21a of FIG. 2 may be, for example, alkyl-substituted β-diketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones such as 1,1,1-trifluoropentane-2,4-dione, 1,1,1-trifluoro-5,5-dimethyl-hexane-2,4-dione, 1,1,1,5,5,5-hexafluoropentane-2,4-dione, and 1,3-diperfluorohexylpropane-1,3-dione; and ether-substituted β-diketones such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy) heptane-3,5-dione, but example embodiments of the inventive concepts are not limited thereto.

A cyclopentadiene compound that may be used as the organic coordination compound of the source material 16 used in operation S21a of FIG. 2 may be, for example, cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclepentadiene, dimethylcyclopentadiene, or tetramethylcyclopentadiene, but example embodiments of the inventive concepts are not limited thereto.

As described with reference to FIGS. 1 to 3, according to example embodiments, the modifier 14 and the source material 16 may be supplied into the reaction chamber 10 and the reaction material 18 may be then supplied into the reaction chamber 10, thereby growing a material layer.

FIGS. 4A to 4G are timing diagrams of the order of methods of supplying the modifier, the source material, and the reaction material as described with reference to FIG. 2.

In FIGS. 4A to 4G, each of feed materials may be pulse-supplied. Flow rates and feeding times of the respective feed materials may not be proportional to the heights and widths of pulses shown in FIGS. 4A to 4G.

Figure 4A:
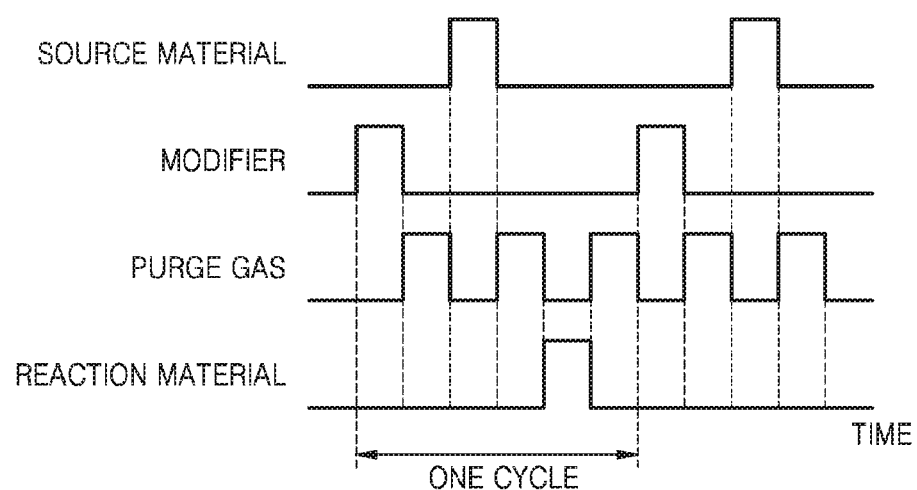
FIGS. 4A to 4G are timing diagrams of a method and process of supplying a modifier, a source material, and a reaction material in FIG. 2.

Referring to FIG. 4A, after a modifier 14 is supplied into a reaction chamber 10, a source material 16 may be supplied into the reaction chamber 10.

When the modifier 14 is supplied into the reaction chamber 10, the modifier 14 may be physisorbed on a surface of a substrate 100. The reaction chamber 10 may be purged with a purge gas 19 so that the physisorbed modifier 14 may be one monolayer or less.

Thereafter, when the source material 16 is supplied, the source material 16 may be physisorbed on the surface of the substrate 100 while the chemisorption of the source material 16 on the substrate 100 is being controlled. Although the source material 16 may be directly chemisorbed on the substrate 100, since a considerable portion of the surface of the substrate 100 is covered with the modifier 14, the source material 16 may be physisorbed on the substrate 100 via the modifier 14. When the reaction chamber 10 is purged with the purge gas 19 again, an adsorption layer may be obtained by adsorbing the source material 16 on the level of one monolayer or less. In particular, excessive adsorption of the source material 16 may be considerably controlled at an entrance of a structure.

Thereafter, when the reaction material 18 is supplied, the reaction material 18 may be reacted with the adsorbed source material 16 to form a material layer, and the modifier 14 may be reacted with the reaction material 18 and removed. When the reaction chamber 10 is purged with a purge gas 19, excessive amounts of reaction material 18 and the reaction byproducts may be removed from the reaction chamber 10.

Figure 4B:
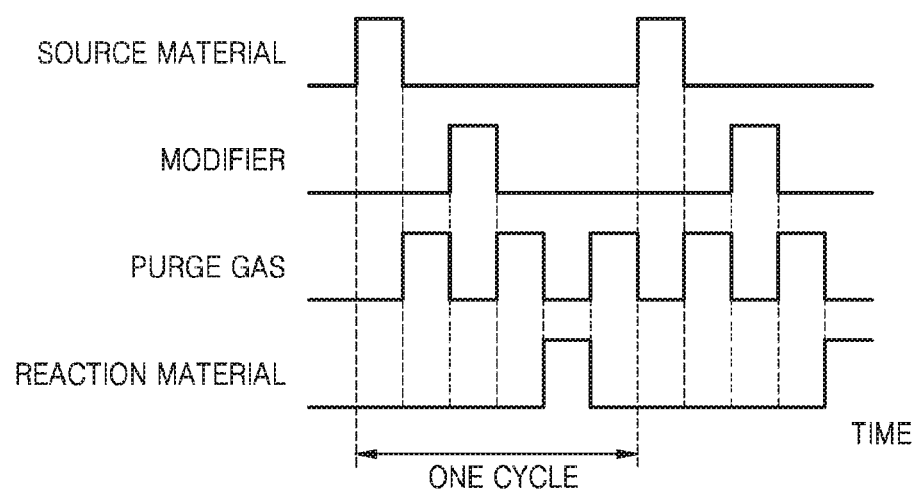

Referring to FIG. 4B, after the source material 16 is supplied into the reaction chamber 10, the modifier 14 may be supplied.

When the source material 16 is supplied into the reaction chamber 10, the source material 16 may be adsorbed on the surface of the substrate 100. In this case, although the source material 16 may be physisorbed on the substrate 100, a considerable amount of source material 16 may be chemisorbed on the substrate 100. In other words, the source material 16 may be directly chemisorbed on the substrate 100, while additional source materials 16 may be physisorbed on the substrate 100 via the chemisorbed source material 16.

When the reaction chamber 10 is purged with the purge gas 19, at least two layers of the source material 16 physisorbed on the substrate 100 may be partially removed, while the physisorbed source material 16 may still remain on the source material 16 that is directly chemisorbed on the substrate 100. Since the physisorbed source material 16 is an excessively adsorbed source material, it may be necessary to remove the physisorbed source material 16 to form a conformal material layer.

Subsequently, when the modifier 14 is supplied, the modifier 14 may be combined with the source material 16 due to van der Waals attraction. More specifically, when the modifier 14 is an ether-based material, oxygen contained in ether may be combined with the central atom of the source material. The physisorbed source material 16 may be released due to the combination, and the excessively adsorbed source material 16 may be mostly removed. When the reaction chamber 10 is purged with the purge gas 19 again, the excessive modifier 14 and the reaction byproducts may be removed from the reaction chamber 10, and a layer at which the source material 16 is chemisorbed on the level of one monolayer or less may be obtained. The reaction byproducts may include a combination of the modifier 14 with the source material 16.

Subsequently, when the reaction material 18 is supplied, the reaction material 18 may be reacted with the source material 16 that is chemisorbed in a monolayered state to form a material layer, and the modifier 14 may be reacted with the reaction material 18 and removed. When the reaction chamber 10 is purged with the purge gas 19, excessive amounts of reaction material 18 and the reaction byproducts may be removed from the reaction chamber 10.

Figure 4C:
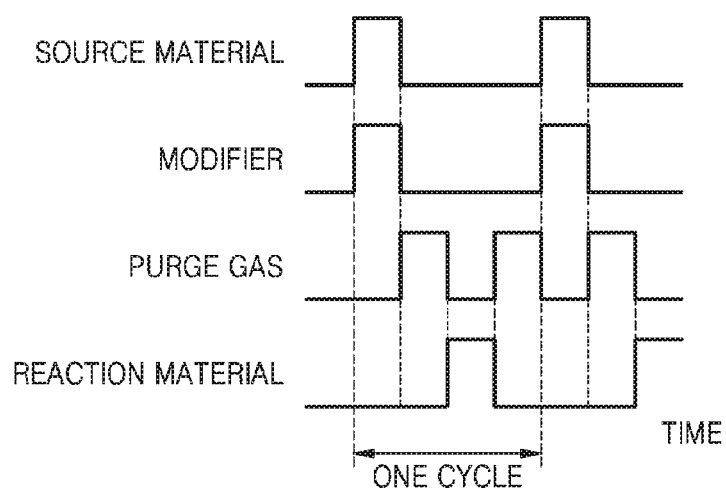

Referring to FIG. 4C, the source material 16 and the modifier 14 may be simultaneously supplied into the reaction chamber 10.

Due to characteristics of the source materials 16, the source materials 16 may be combined with each other and form a dimer or trimer. When the dimer or trimer is adsorbed on the surface of the substrate 100, at least two layers of the source material 16 may be excessively adsorbed. When the modifier 14 and the source material 16 are simultaneously supplied, a probability of the source material 16 forming the dimer or trimer may be reduced so that the excessive adsorption of the source material 16 may be alleviated.

Furthermore, mechanisms described with reference to FIGS. 4A and 4B may be dynamically performed to prevent excessive adsorption of the source material 16.

When the reaction chamber 10 is purged with the purge gas 19, excessive amounts of the source material 16 and the modifier 14 may be removed from the reaction chamber 10. Also, unnecessary byproducts may be removed from the reaction chamber 10.

Thereafter, when the reaction material 18 is supplied, the reaction material 18 may be reacted with the adsorbed source material 16 to form a material layer, and the modifier 14 in the reaction chamber 10 may be reacted with the reaction material 18 and removed. When the reaction chamber 10 is purged with the purge gas 19, excessive amounts of the reaction material 18 and the reaction byproducts may be removed from the reaction chamber 10.

Figure 4D:
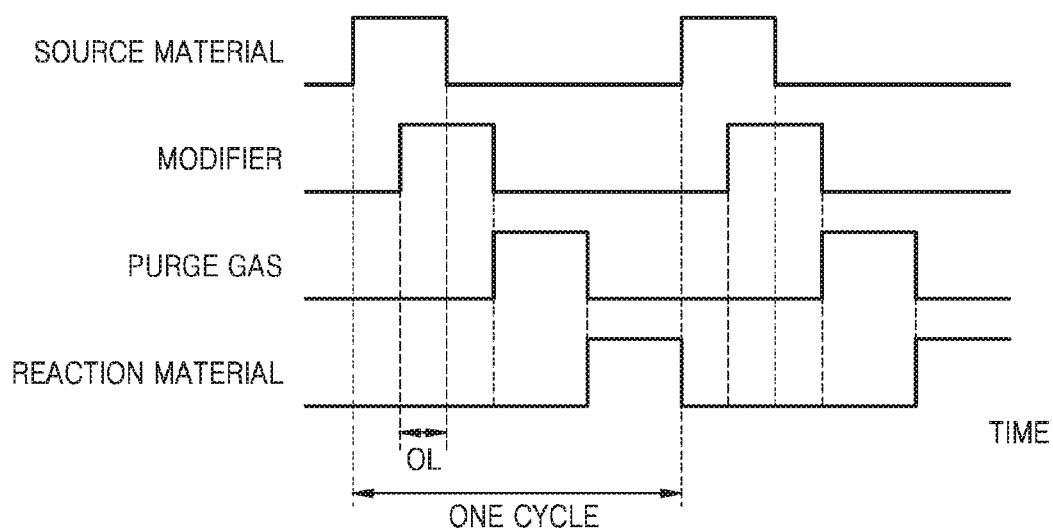

Referring to FIG. 4D, after the source material 16 is supplied into the reaction chamber 10, the modifier 14 may be supplied into the reaction chamber 10. In this case, a time duration for which the source material 16 is supplied may overlap with a time duration for which the modifier 14 is supplied for a predetermined (or, alternatively, set) time OL.

In this case, excessive adsorption of the source material 16 may be prevented due to the reaction mechanism described above with reference to FIG. 4B during a time duration for which the supplying of the source material 16 does not overlap with the supplying of the modifier 14. Also, excessive adsorption of the source material 16 may be prevented due to the reaction mechanisms described with reference to FIGS. 4A and 4B during a time duration for which the supplying of the source material 16 overlaps with the supplying of the modifier 14.

Other detailed descriptions are the same as described with reference to FIGS. 4A to 4C and will be omitted here.

Figure 4E:
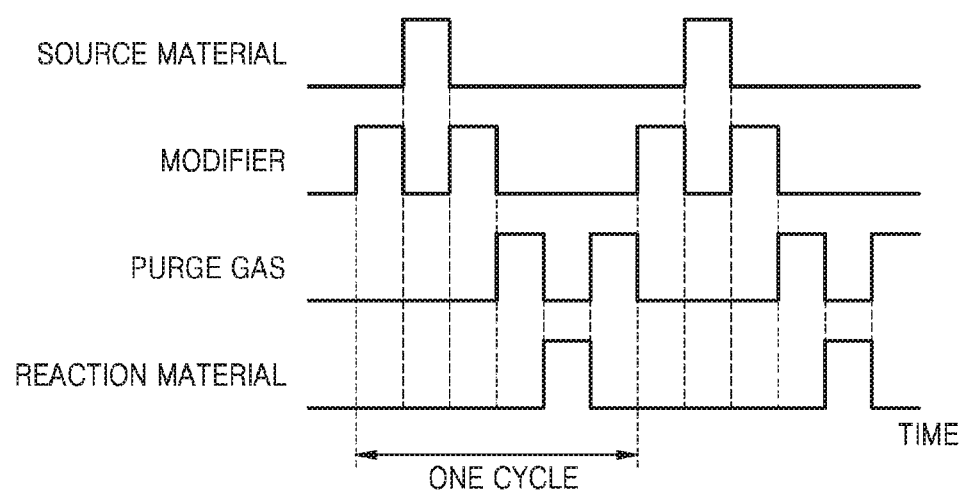

Referring to FIG. 4E, the modifier 14 may be supplied all around a time duration for which the source material 16 is supplied into the reaction chamber 10. Excessive adsorption of the source material 16 may be prevented due to the modifier 14 supplied before the source material 16, as described with reference to FIG. 4A. Also, excessive adsorption of the source material 16 may be prevented due to the modifier 15 supplied after the source material 16, as described with reference to FIG. 4B.

Other detailed descriptions are the same as described with reference to FIGS. 4A to 4C and will be omitted here.

Figure 4F:
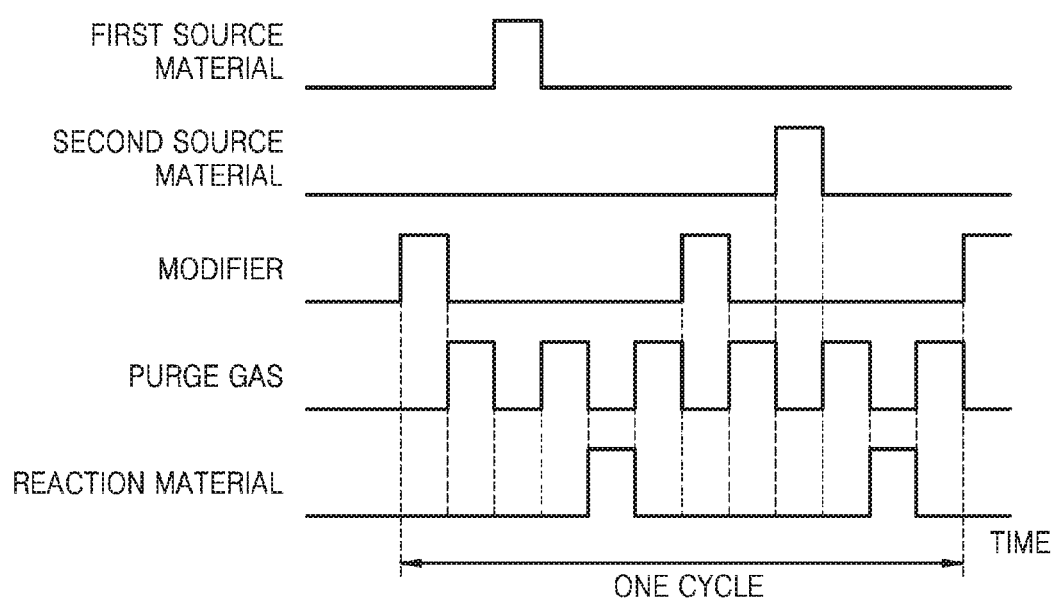

Referring to FIG. 4F, the present example embodiments differ from the example embodiments shown in FIG. 4A in that a first source material and a second source material, which are different source materials, are used.

To begin with, a modifier 14 may be supplied into a reaction chamber 10, and the reaction chamber 10 may be purged to form a monolayer of a physisorbed modifier 14. A first source material and a reaction material may be supplied to form a first material layer. Since a specific reaction mechanism is the same as described with reference to FIG. 4A, additional descriptions thereof are omitted here.

Thereafter, the modifier 14 may be supplied again into the reaction chamber 10, and the reaction chamber 10 may be purged to form a monolayer of a physisorbed modifier 14. A second source material and a reaction material may be supplied to form a second material layer. Since a specific reaction mechanism is the same as described with reference to FIG. 4A, additional descriptions thereof are omitted here.

Figure 4G:
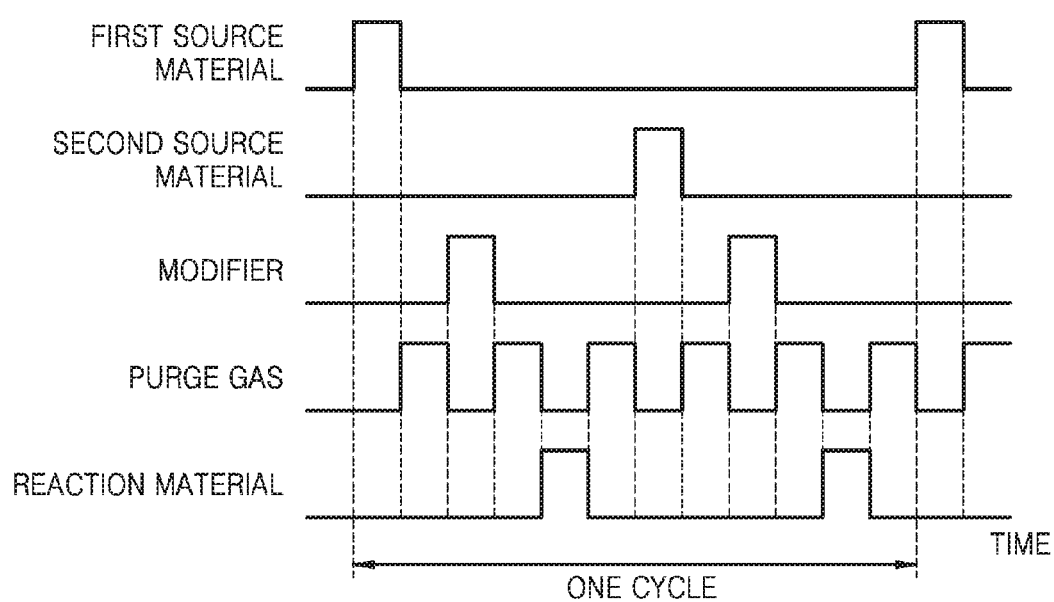

Referring to FIG. 4G, the present example embodiments differ from the example embodiments shown in FIG. 4B in that a first source material and a second source material, which are different source materials, are used.

To begin with, the first source material may be supplied into the reaction chamber 10, and the reaction chamber 10 may be purged to form a first source material layer, which is adsorbed on the surface of a substrate. The modifier 14 may be supplied to remove an excessively adsorbed first source material. Thereafter, a reaction material may be supplied to form a first material layer. Since a specific reaction mechanism is the same as described with reference to FIG. 4B, additional descriptions thereof are omitted here.

Subsequently, the second source material may be supplied into the reaction chamber 10, and the reaction chamber 10 may be purged to form a second source material layer, which is adsorbed on the surface of the substrate. The modifier 14 may be supplied to remove an excessively adsorbed second source material. Thereafter, a reaction material may be supplied to form a second material layer. Since a specific reaction mechanism is the same as described with reference to FIG. 4B, additional descriptions thereof are omitted here.

Figure 5:
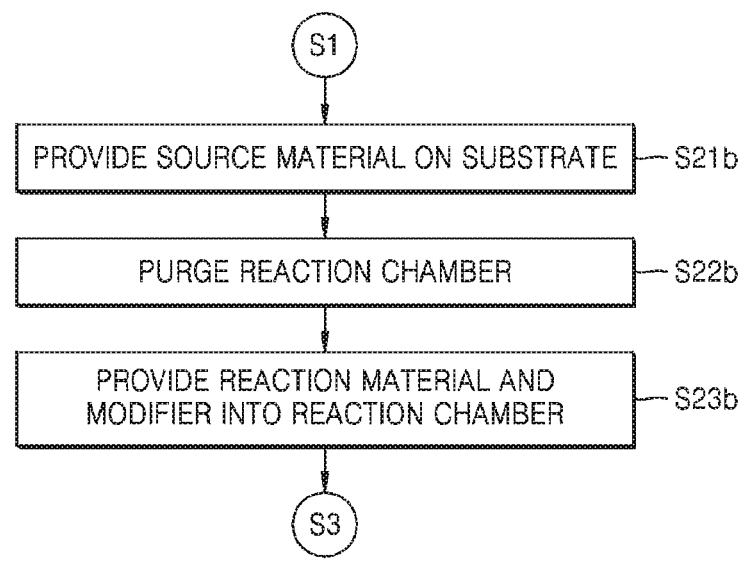
FIG. 5 is a detailed flowchart of an operation of forming a material layer on the substrate, according to some example embodiments.

FIG. 5 is a detailed flowchart of an operation of forming a material layer on the substrate, according to some example embodiments.

Referring to FIG. 5, a source material 16 may be provided on a substrate 100 (S21*b*). The source material 16 may be adsorbed on the substrate 100. In this case, the source material may be excessively physisorbed on portions of the substrate to form two or more layers of the source material.

Subsequently, the reaction chamber 10 may be purged with a purge gas (S22*b*). An excessive amount of source material adsorbed on the substrate 100 may be removed due to the purge process.

Thereafter, a reaction material 18 and a modifier 14 may be supplied into the reaction chamber 10. Since the reaction material 18 and the modifier 14 are described in detail above, detailed descriptions thereof are omitted.

FIGS. 6A to 6D are timing diagrams of a method and order of supplying the modifier, the source material, and the reaction material as in FIG. 5.

Figure 6A:
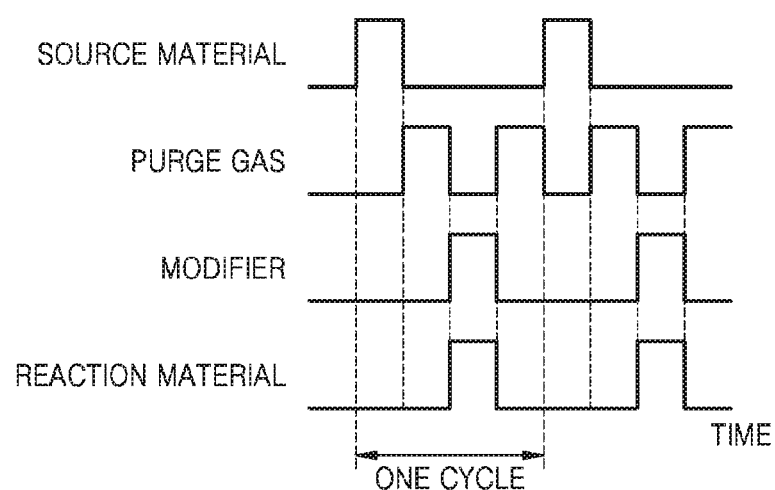
FIGS. 6A to 6D are timing diagrams of a method and order of supplying a modifier, a source material, and a reaction material in FIG. 5.

Referring to FIG. 6A, the reaction material 18 and the modifier 14 may be supplied such that the supplying of the reaction material 18 temporally overlaps with the supplying of the modifier 14.

To begin, when the source material 16 is supplied into a reaction chamber 10, the source material 16 may be adsorbed on the surface of a substrate 100. The reaction chamber 10 may be purged with a purge gas 19 to remove an excessive amount of the source material 16.

Thereafter, the reaction material 18 and the modifier 14 may be simultaneously supplied for the same time duration. After that, the reaction chamber 10 may be purged with the purge gas 19 so that excessive amounts of the reaction material 18 and the modifier 14 and the reaction byproducts may be removed from the reaction chamber 10.

Figure 6B:
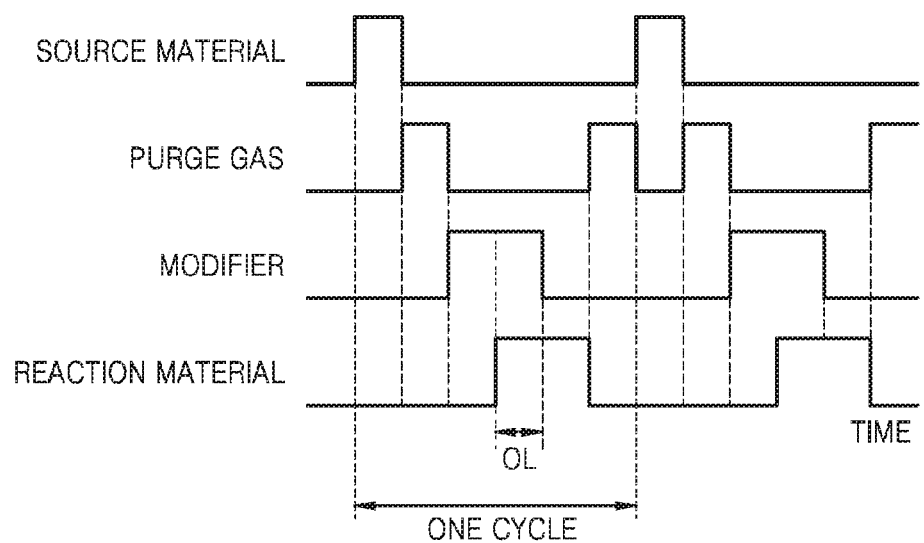

Referring to FIG. 6B, after the modifier 15 is fed into the reaction chamber 10, the reaction material 18 may be supplied into the reaction chamber 10. In this case, a time duration for which the modifier 15 is supplied may overlap with a time duration for which the reaction material 18 is supplied for a predetermined (or, alternatively, set) time OL.

To begin, when the source material 16 is supplied into the reaction chamber 10, the source material 16 may be adhered on the surface of the substrate 100. The reaction chamber 10 may be purged with the purge gas 19 to remove an excessive amount of the source material 16.

Thereafter, the modifier 14 may be supplied to induce the reaction mechanism described with reference to FIG. 4B, the reaction material 18 may be then supplied to form a material layer.

Thereafter, the reaction chamber 10 may be purged with the purge gas 19 so that excessive amounts of the reaction material 18 and the modifier 14 and the reaction byproducts may be removed from the reaction chamber 10.

Figure 6C:
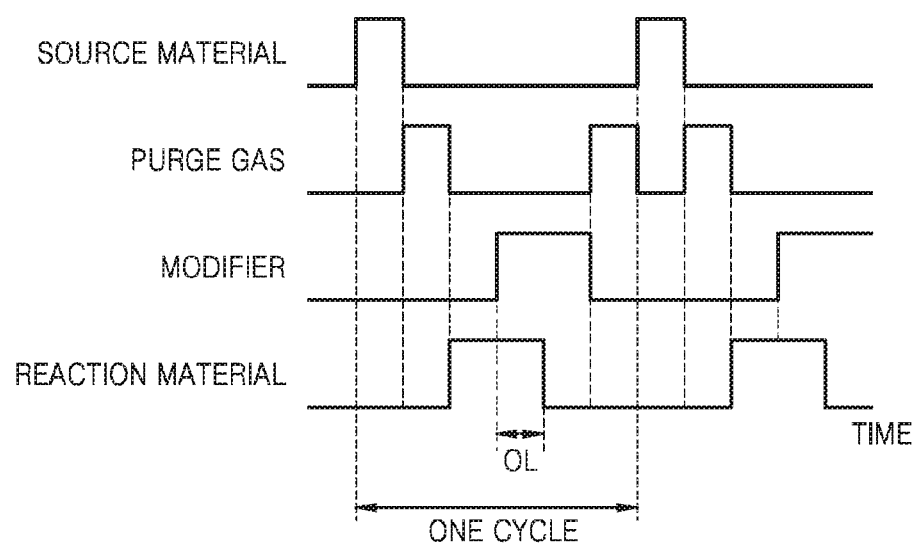

Referring to FIG. 6C, after the reaction material 18 is supplied into the reaction chamber 10, the modifier 14 may be supplied into the modifier 14. In this case, a time duration for which the reaction material 18 is supplied may overlap with a time duration for which the modifier 14 is supplied for a predetermined (or, alternatively, set) time OL.

To begin with, when the source material 16 is supplied into the reaction chamber 10, the source material 16 may be adsorbed on the surface of the substrate 100. The reaction chamber 10 may be purged with the purge gas 19 to remove an excessive amount of the source material 16.

Thereafter, the reaction material 18 may be supplied to form a material layer. Subsequently, the modifier 14 may be supplied to induce the reaction mechanism described with reference to FIG. 4A and contribute toward preventing excessive adsorption.

Thereafter, the reaction chamber 10 may be purged with the purge gas 19 so that excessive amounts of the reaction material 18 and the modifier 14 and the reaction byproducts may be removed from the reaction chamber 10.

Figure 6D:
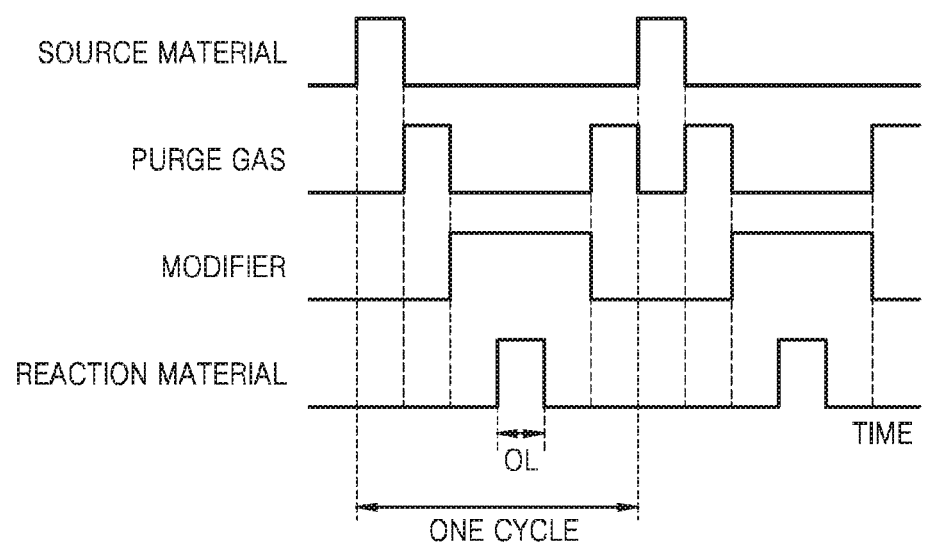

Referring to FIG. 6D, a time period for which the reaction material 18 is supplied into the reaction chamber 10 may be nested in a time period for which the modifier 14 is supplied.

To begin, when the source material 16 is supplied into the reaction chamber 10, the source material 16 may be adsorbed on the surface of the substrate 100. The reaction chamber 10 may be purged with the purge gas 19 to remove an excessive amount of the source material 16.

Thereafter, the modifier 14 may be continuously supplied into the reaction chamber 10 from before the supplying of the reaction material 18 has started to after the supplying of the reaction material 18 is ended. Thus, excessive adsorption of the source material 16 may be prevented due to the reaction mechanisms described with reference to FIGS. 4A to 4C.

Thereafter, the reaction chamber 10 may be purged with a purge gas 19 so that byproducts of a reaction of the excessive reaction material 18 with the modifier 14 may be removed from the reaction chamber 10.

EXPERIMENTAL EXAMPLE 1

A zirconium oxide ($ZrO_2$) material layer was formed on a bare silicon substrate without a modifier by using TEMAZ as a source material and using ozone ($O_3$) serving as an oxidizer as a reaction material.

Also, $ZrO_2$ material layers were respectively formed by using methanol and tetrahydrofuran (THF) as modifiers according to a timing scheme shown in FIG. 4A.

Figure 7:
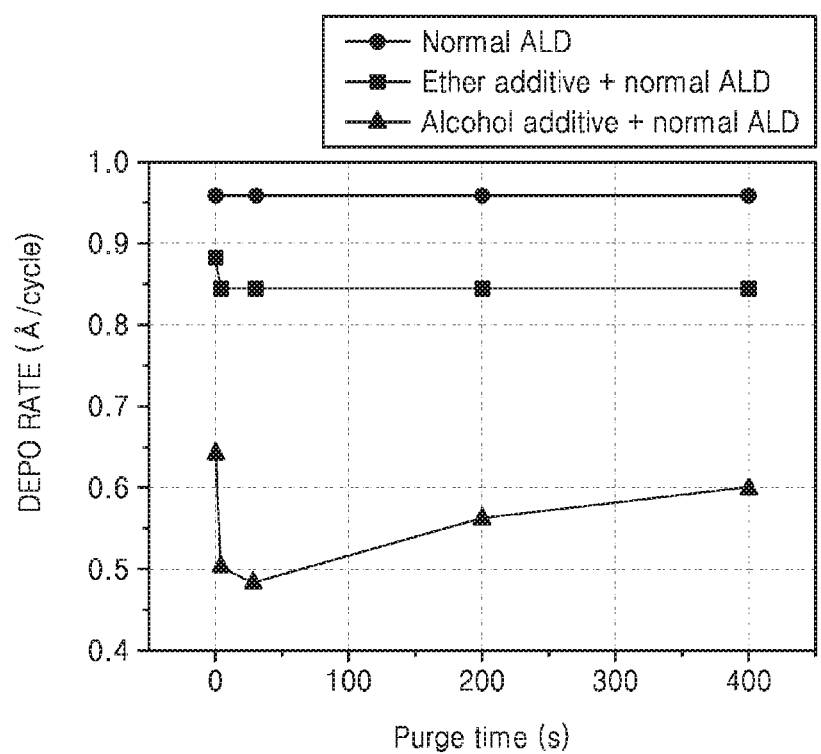
FIG. 7 is a graph of a deposition rate of a material layer relative to a purge time.

In particular, after the material layer was adsorbed on a silicon substrate by supplying the modifier, a deposition rate (Å/cycle) of the material layer was calculated while varying a purge time. FIG. 7 is a graph of the deposition rate of the material layer relative to the purge time.

As a result, when methanol was used as the modifier, even if a purge time of about 400 seconds elapsed, a deposition rate of the $ZrO_2$ material layer was not saturated. By comparison, when THF was used as the modifier, after an initial purge time of about 5 seconds elapsed, it could be confirmed that the deposition rate of the $ZrO_2$ material layer was immediately stabilized.

While not wishing to be bound to a specific theory, it is believed that when methanol was used as the modifier, the deposition rate of the material layer was rapidly reduced before an elapse of about 100 seconds due to the desorption of a modifier.

EXPERIMENTAL EXAMPLE 2

A $ZrO_2$ material layer was formed on a bare silicon substrate without a modifier by using TEMAZ as a source material and using ozone serving as an oxidizer as a reaction material.

Also, $ZrO_2$ material layers were respectively formed by using methanol and THF as modifiers according to the timing scheme shown in FIG. 4A.

Figure 8:
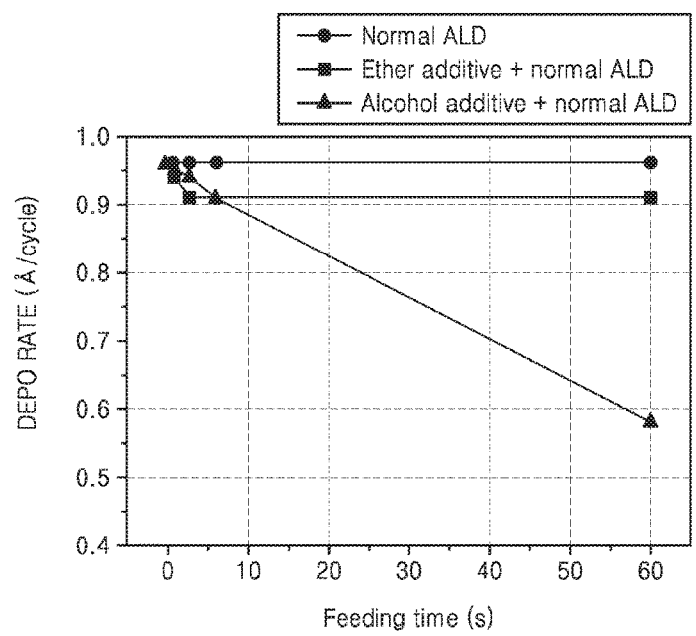
FIG. 8 is a graph of a deposition rate of a material layer relative to a feeding time.

In particular, a deposition rate (Å/cycle) of the material layer was calculated while varying a feeding time of the modifier. FIG. 8 is a graph of the deposition rate of the material layer relative to the feeding time of the modifier.

As a result, when methanol was used as the modifier, it was confirmed that the deposition rate of the $ZrO_2$ material layer was continuously reduced until a feeding time reached about 60 seconds. When THF was used as the modifier, the deposition rate of the $ZrO_2$ material layer was continuously reduced for about 3 seconds. However, when a feeding time became more than 3 seconds, it was confirmed that the deposition rate of the $ZrO_2$ material layer was immediately stabilized.

While not wishing to be bound to a specific theory, it is believed from Experimental Examples 1 and 2 that the above-described results were obtained because THF serving as an ether-based modifier is less sensitive to process parameters, such as a process pressure, a purge time, and a process temperature, than methanol serving as an alcohol-based modifier.

EXPERIMENTAL EXAMPLE 3

To observe whether or not a step coverage is improved when an oxide layer is deposited using a modifier in an actual trench structure, ALD experiments were conducted by using methanol and THF as modifiers. A trench having a width of about 50 nm, a depth of about 350 nm, and an aspect ratio of about 7 was used as a target trench structure, and a $ZrO_2$ material layer was formed by using TEMAZ as a source material and using ozone ($O_3$) serving as an oxidizer as a reaction material.

A feeding scheme of each feed material was carried out according to the feeding scheme shown in FIG. 4A. By supplying the modifier for about 5 seconds and 400 seconds, thicknesses of formed $ZrO_2$ material layers were measured at a top and a bottom portion of a trench.

As a result, Table 1 was obtained.

TABLE 1

|  | Methanol | | THF | |
| --- | --- | --- | --- | --- |
| Modifier feeding time | 5 sec | 400 sec | 5 sec | 400 sec |
| Top of trench | 85 Å | 70 Å | 90 Å | 94 Å |
| Bottom of trench | 79 Å | 49 Å | 83 Å | 89 Å |
| Step coverage | 93% | 70% | 92% | 95% |

When methanol was used as the modifier and supplied for a short feeding time duration of about 5 seconds, it was possible to ensure a step coverage of about 93%. However, when the feeding time duration was increased to about 400 seconds, a thickness of a $ZrO_2$ material layer formed on a bottom surface of a trench became much smaller than a thickness of a $ZrO_2$ material layer formed on an upper portion of the trench. As a result, the step coverage was reduced to about 70%.

When THF was used as the modifier and supplied for a feeding time duration of about 5 seconds, it was possible to ensure a step coverage of about 92%. Also, even if the feeding time duration was increased to about 400 seconds, it was still possible to ensure a good step coverage of about 95%.

While not wishing to be bound to a specific theory, it is believed that an ether-based modifier is a more stable modifier than an alcohol-based modifier based on the results of Table 1. When the ether-based modifier is used, a good step coverage may be stably obtained despite variations in other process parameters.

By using a method of forming a material layer according to some example embodiments, a material layer having a good step coverage may be stably formed despite variations in other process parameters.

FIGS. 9A to 9J are cross-sectional views of sequential process operations of a method of manufacturing an IC device (refer to FIG. 9J) according to example embodiments.

Figure 9A:
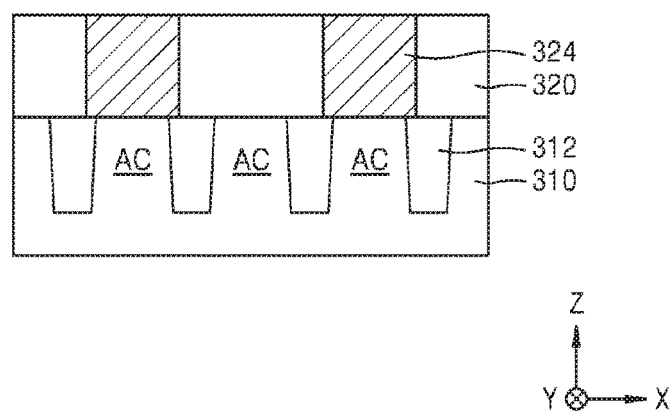
FIGS. 9A to 9J are cross-sectional views of sequential process operations of a method of manufacturing an IC device according to some example embodiments.

Referring to FIG. 9A, an interlayer insulating layer 320 may be formed on a substrate 310 including a plurality of active regions AC. Thereafter, a plurality of conductive regions 324 may be formed through the interlayer insulating layer 320 and connected to the plurality of active regions AC.

The substrate 310 may include a semiconductor (e.g., silicon or germanium) or a compound semiconductor (e.g., SiGe, SiC, GaAs, InAs, or InP). In some example embodiments, the substrate 310 may include at least one of a Group III-V material and a Group IV material. The Group III-V material may be a binary compound, a ternary compound, or a quaternary compound including at least one Group III atom and at least one Group V atom. The Group III-V material may be compound including a Group III atom (e.g., at least one atom of In, Ga, and Al) and a Group V atom (e.g., at least one atom of As, P, and Sb). For example, the Group III-V material may be selected from InP, $In_zGa_{1-z}As$ ($0 \le z \le 1$), and $Al_zGa_{1-z}As$ ($0 \le z \le 1$). The binary compound may be, for example, any one of InP, GaAs, InAs, InSb, and GaSb. The ternary compound may be any one of InGaP, InGaAs, AnnAs, InGaSb, GaAsSb, and GaAsP. The Group IV material may be silicon or germanium. However, the Group III-V material and the group IV material that may be used for an IC device according to example embodiments are not limited to the above-described examples. In some example embodiments, the substrate 310 may have a silicon-on-insulator (SOI) structure. The substrate 310 may include a conductive region, for example, a doped well or a doped structure.

The plurality of active regions AC may be defined by a plurality of device isolation regions 312 formed in the substrate 310. The device isolation regions 312 may include a silicon oxide layer, a silicon nitride layer, a silicon oxynitride layer, or a combination thereof.

The interlayer insulating layer 320 may include a silicon oxide layer.

The plurality of conductive regions 324 may be connected to one terminal of switching devices (not shown) (e.g., field-effect transistors (FETs)) formed on the substrate 310. The plurality of conductive regions 324 may include poly-Si, a metal, a conductive metal nitride, a metal silicide, or a combination thereof, but example embodiments of the inventive concepts are not limited thereto.

Figure 9B:
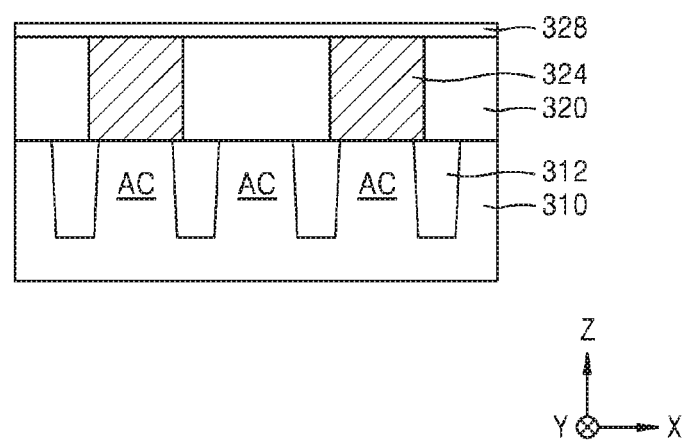

Referring to FIG. 9B, an insulating layer 328 may be formed to cover the interlayer insulating layer 320 and the plurality of conductive regions 324. The insulating layer 328 may be used as an etch stop layer.

The insulating layer 328 may include an insulating material having an etch selectivity with respect to the interlayer insulating layer 320 and a mold layer 330 (refer to FIG. 9C) formed during a subsequent process. In some example embodiments, the insulating layer 328 may include silicon nitride, silicon oxynitride, or a combination thereof.

In some example embodiments, the insulating layer 328 may be formed to a thickness of about 100 Å to about 600 Å, but example embodiments of the inventive concepts are not limited thereto.

Figure 9C:
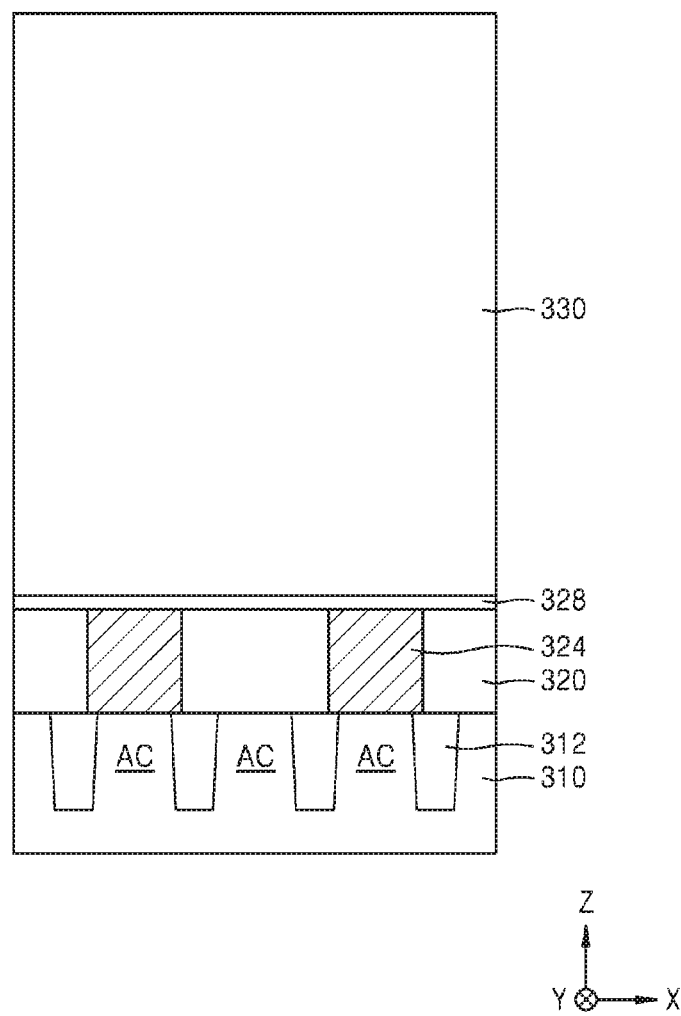

Referring to FIG. 9C, the mold layer 330 may be formed on the insulating layer 328. In some example embodiments, the mold layer 330 may include an oxide layer. For example, the mold layer 330 may include an oxide layer, such as a boro phospho silicate glass (BPSG) layer, a phospho silicate glass (PSG) layer, an undoped silicate glass (USG) layer, a spin on dielectric (SOD) layer, or an oxide layer formed by using a high-density-plasma chemical vapor deposition (HDP CVD) process. The mold layer 130 may be formed by using a thermal CVD process or a plasma CVD process. In some example embodiments, the mold layer 330 may be formed to a thickness of about 1000 Å to about 20000 Å, but example embodiments of the inventive concepts are not limited thereto.

In some example embodiments, the mold layer 330 may include a support layer (not shown). The support layer may include a material having an etch selectivity with respect to the mold layer 330 and have a thickness of about 50 Å to about 3000 Å. When the mold layer 330 is subsequently removed by using a limulus amoebocyte lysate (LAL) lift-off process in an etching atmosphere of, for example, ammonium fluoride ($NH_4F$), hydrofluoric acid (HF), and water, the support layer may include a material having a relatively low etch rate with respect to LAL. In some example embodiments, the support layer may include silicon nitride, silicon carbonitride, tantalum oxide, titanium oxide, or a combination thereof, but a material forming the support layer is not limited thereto.

Figure 9D:
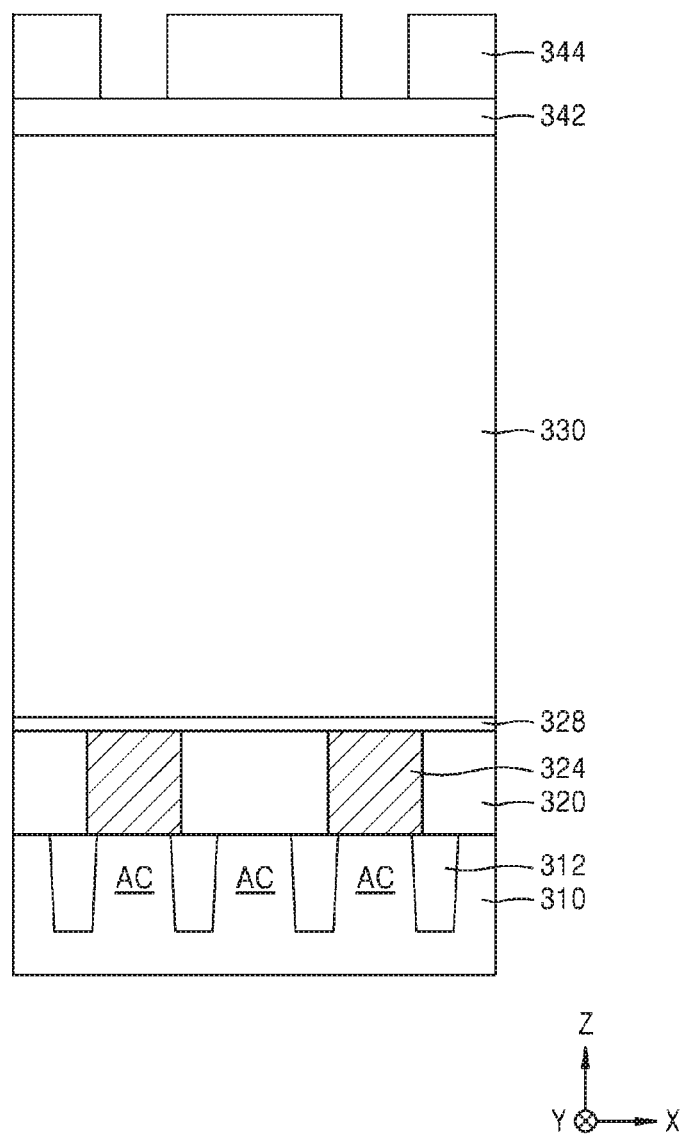

Referring to FIG. 9D, a sacrificial layer 342 and a mask pattern 344 may be sequentially formed on the mold layer 330.

The sacrificial layer 342 may include an oxide layer, such as a BPSG layer, a PSG layer, an USG layer, a SOD layer, or an oxide layer formed by using an HDP CVD process. The sacrificial layer 342 may have a thickness of about 500 Å to about 2000 Å. The sacrificial layer 342 may serve to protect the support layer included in the mold layer 330.

The mask pattern 344 may include an oxide layer, a nitride layer, a poly-Si layer, a photoresist layer, or a combination thereof. A region where a lower electrode of a capacitor will be formed may be defined by the mask pattern 344.

Figure 9E:
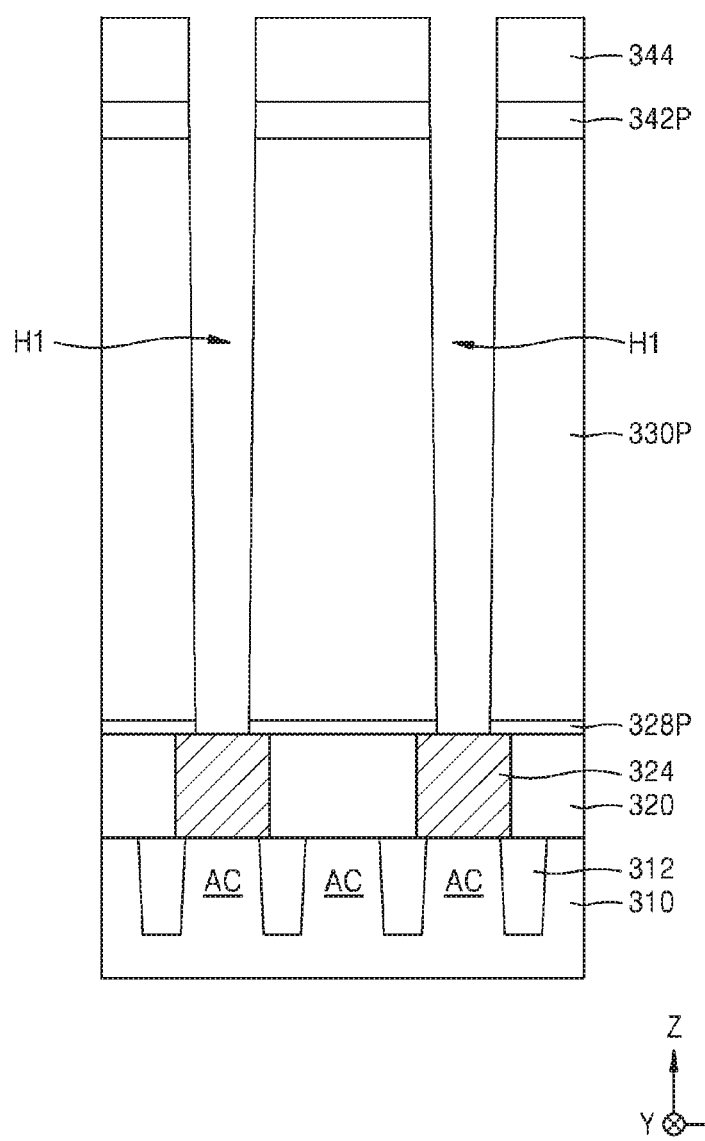

Referring to FIG. 9E, the sacrificial layer 342 and the mold layer 330 may be dry etched by using the mask pattern 344 as an etch mask and using the insulating layer 328 as an etch stop layer, thereby forming a sacrificial pattern 342P and a mold pattern 330P to define a plurality of holes H1.

In this case, the insulating layer 328 may also be etched due to excessive etching, thereby forming an insulating pattern 328P to expose a plurality of conductive regions 324.

Figure 9F:
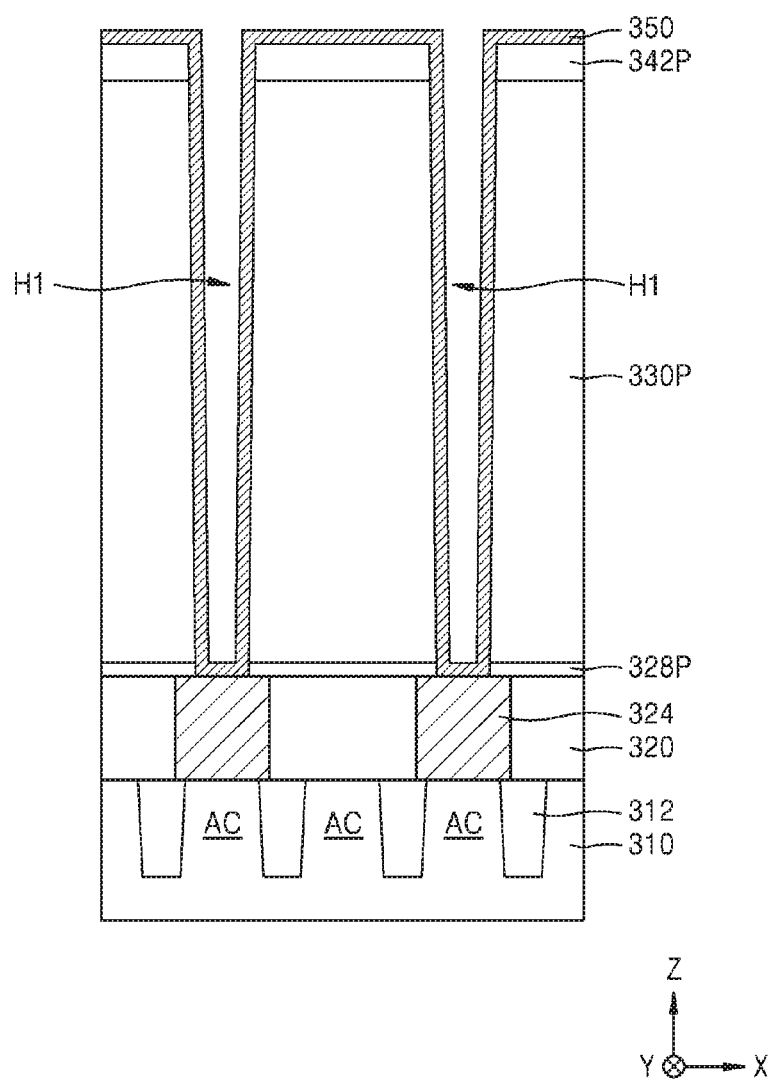

Referring to FIG. 9F, after the mask pattern 344 is removed from the resultant structure of FIG. 9E, a conductive layer 350 for forming a lower electrode may be formed to cover inner sidewalls of the respective holes H1, an exposed surface of the insulating pattern 328P, surfaces of the plurality of conductive regions 324 exposed in the respective holes H1, and an exposed surface of the sacrificial pattern 342P.

The conductive layer 350 for forming the lower electrode may be conformally formed on the inner sidewalls of the plurality of holes H1 to leave partial inner spaces of the respective holes H1.

In some example embodiments, the conductive layer 350 for forming the lower electrode may include a doped semiconductor, a conductive metal nitride, a metal, a metal silicide, a conductive oxide, or a combination thereof. For instance, the conductive layer 350 for forming the lower electrode may include TiN, TiAlN, TaN, TaAlN, W, WN, Ru, RuO$_2$, SrRuO$_3$, Ir, IrO$_2$, Pt, PtO, SRO (SrRuO$_3$), BSRO (Ba,Sr)RuO$_3$), CRO (CaRuO$_3$), LSCo ((La,Sr)CoO$_3$), or a combination thereof, but a material forming the conductive layer 350 for forming the lower electrode is not limited thereto.

The conductive layer 350 for forming the lower electrode may be formed by using a CVD process, a metal organic CVD (MOCVD) process, or an ALD process. The conductive layer 350 for forming the lower electrode may be formed to a thickness of about 20 nm to about 100 nm, but example embodiments of the inventive concepts are not limited thereto.

Figure 9G:
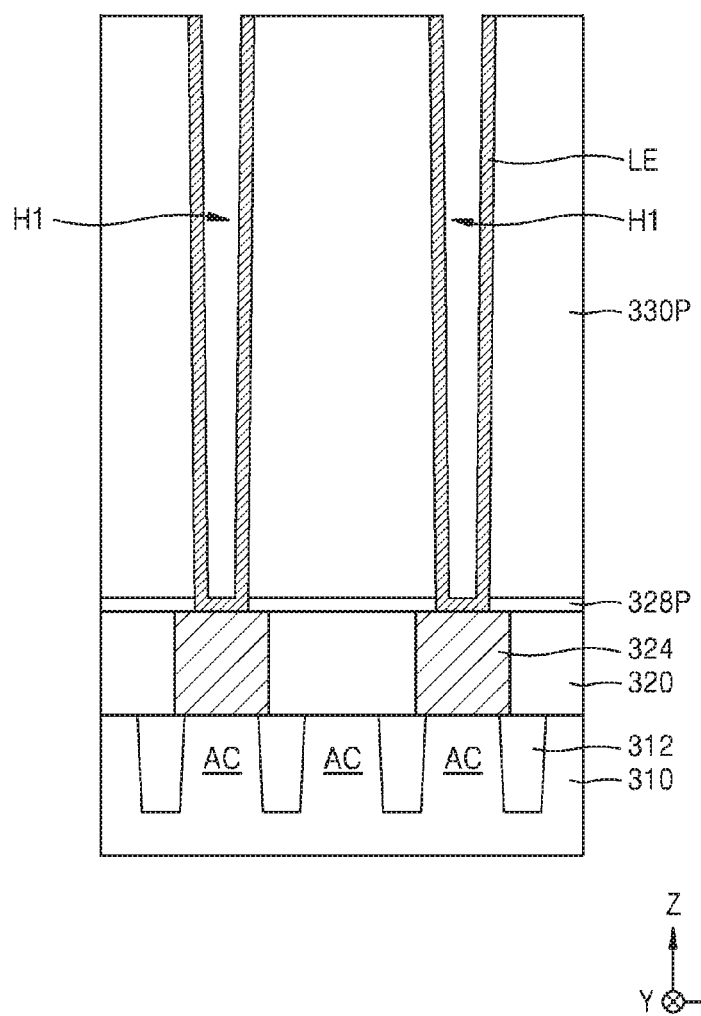

Referring to FIG. 9G, an upper portion of the conductive layer 350 for forming the lower electrode may be partially removed so that the conductive layer 350 for forming the lower electrode may be separated into a plurality of lower electrodes LE.

To form the plurality of lower electrodes LE, the portion of the upper portion of the conductive layer 350 for forming the lower electrode and the sacrificial pattern 342P (refer to FIG. 9F) may be removed by using an etchback process or a chemical mechanical polishing (CMP) process until a top surface of the mold pattern 330P is exposed.

The plurality of lower electrodes LE may penetrate the insulating pattern 328P and be connected to the conductive regions 324.

Figure 9H:
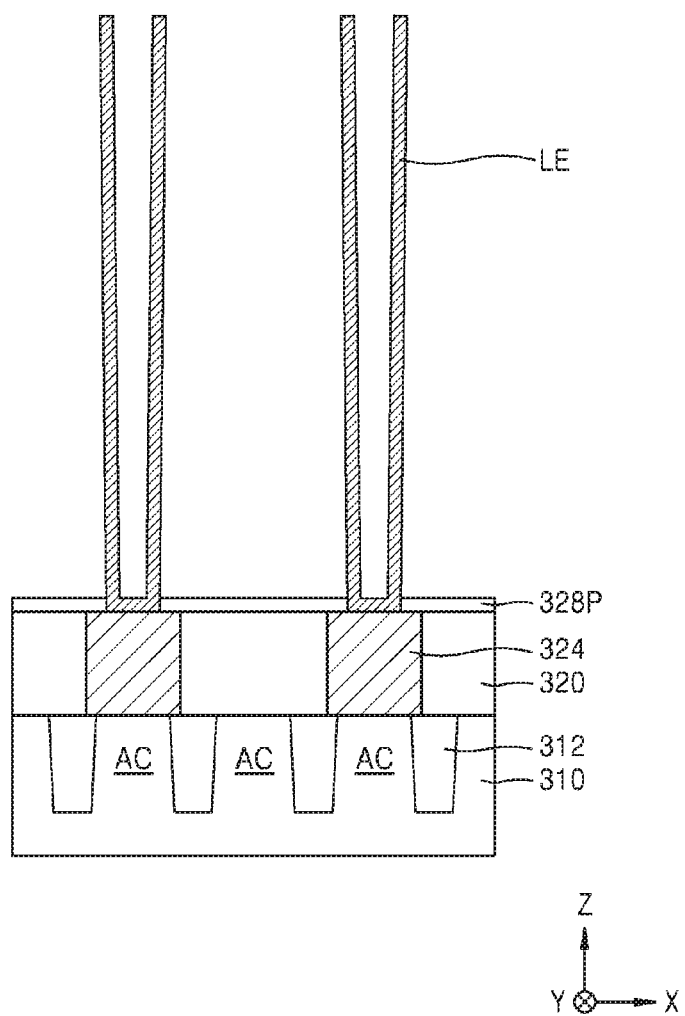

Referring to FIG. 9H, the mold pattern 330P may be removed to expose outer wall surfaces of the plurality of lower electrodes LE having cylindrical shapes.

The mold pattern 330P may be removed by a lift-off process using LAL or hydrofluoric acid.

Figure 9I:
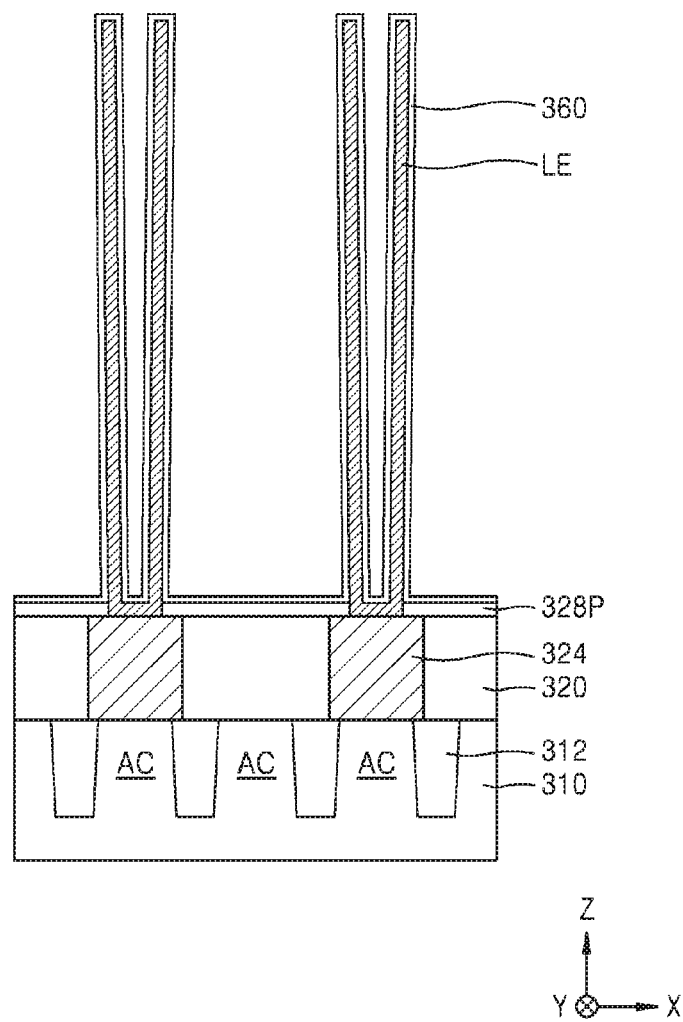

Referring to FIG. 9I, a dielectric layer 360 may be formed on the plurality of lower electrodes LE.

The dielectric layer 360 may be formed to conformally cover exposed surfaces of the plurality of lower electrodes LE.

The dielectric layer 360 may be formed by using an ALD process. The dielectric layer 360 may be formed by the method of forming the material layer as described with reference to FIG. 1 and 2 or 5.

The dielectric layer 360 may include oxide, a metal oxide, nitride, or a combination thereof. In some example embodiments, the dielectric layer 360 may include a ZrO$_2$ layer. For example, the dielectric layer 360 may include a single ZrO$_2$ layer or a multilayered structure including a combination of at least one ZrO$_2$ layer and at least one of Al$_2$O$_3$ layer.

In some example embodiments, the dielectric layer 360 may have a thickness of about 50 Å to about 150 Å, but example embodiments of the inventive concepts are not limited thereto.

Figure 9J:
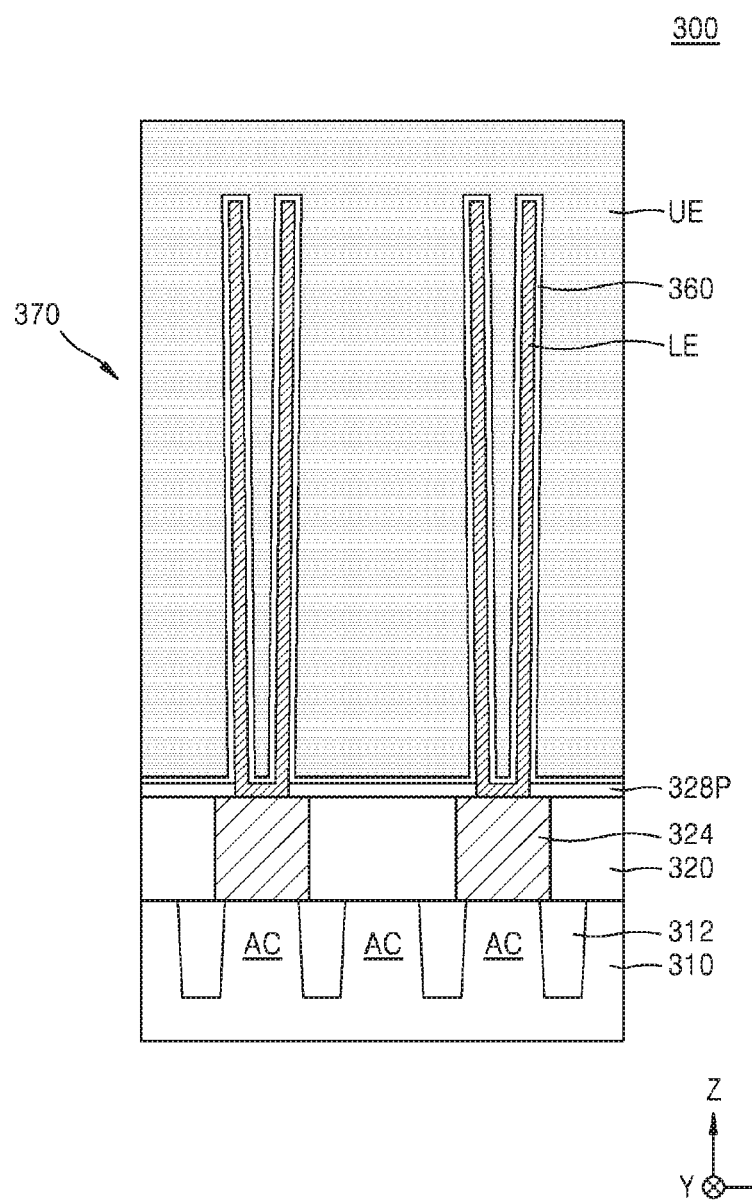

Referring to FIG. 9J, an upper electrode UE may be formed on the dielectric layer 360.

A capacitor 370 may be configured by the lower electrode LE, the dielectric layer 360, and the upper electrode UE.

The upper electrode UE may include a doped semiconductor, a conductive metal nitride, a metal, a metal silicide, a conductive oxide, or a combination thereof. For example, the upper electrode UE may include TiN, TiAlN, TaN, TaAlN, W, WN, Ru, RuO$_2$, SrRuO$_3$, Ir, IrO$_2$, Pt, PtO, SRO (SrRuO$_3$), BSRO (Ba,Sr)RuO$_3$), CRO (CaRuO$_3$), LSCo ((La,Sr)CoO$_3$), or a combination thereof, but a material forming the upper electrode UE is not limited thereto.

The upper electrode UE may be formed by using a CVD process, an MOCVD process, a physical vapor deposition (PVD) process, or an ALD process.

Thus far, the method of manufacturing the IC device 300 including the process of forming the dielectric layer 360 to cover the surfaces of the cylindrical lower electrodes LE has been described with reference to FIGS. 9A to 9J, but example embodiments of the inventive concepts are not limited thereto. For example, pillar-type lower electrodes having no inner spaces may be formed instead of the cylindrical lower electrodes LE. The dielectric layer 360 may be formed on the pillar-type lower electrodes.

In the method of manufacturing the IC device as described with reference to FIGS. 9A to 9J, the formation of the dielectric layer 360 may include forming an adsorption layer of an ether-based modifier and an adsorption layer of a source material on the lower electrode LE according to a method of forming a material layer according to an example embodiment and forming a material containing central atoms by supplying a reaction material, such as an oxidizer or a reducer.

Figure 10A:
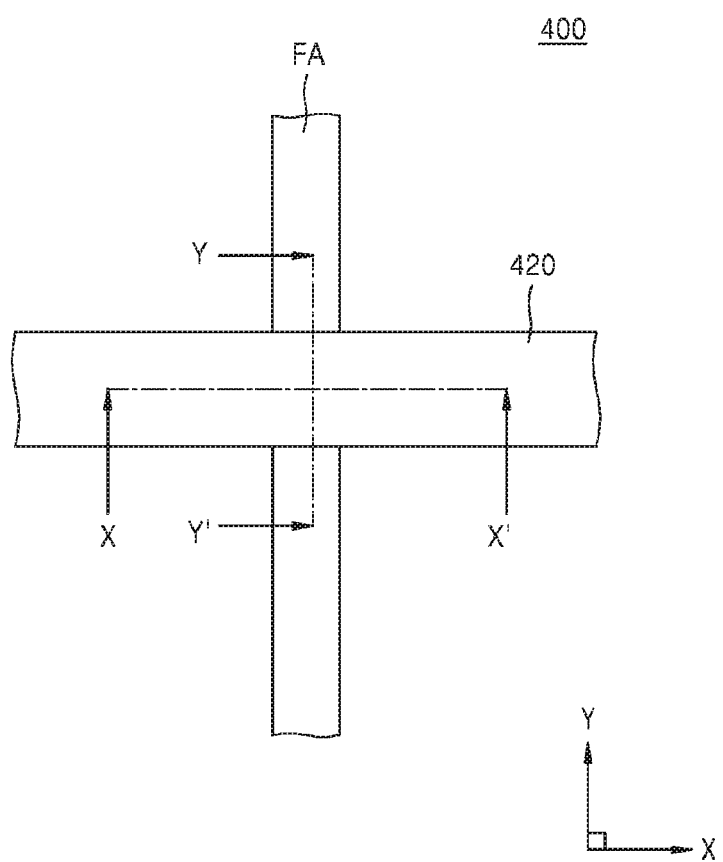
FIG. 10A is a plan view of an integrated circuit (IC) device according to some example embodiments.
Figure 10B:
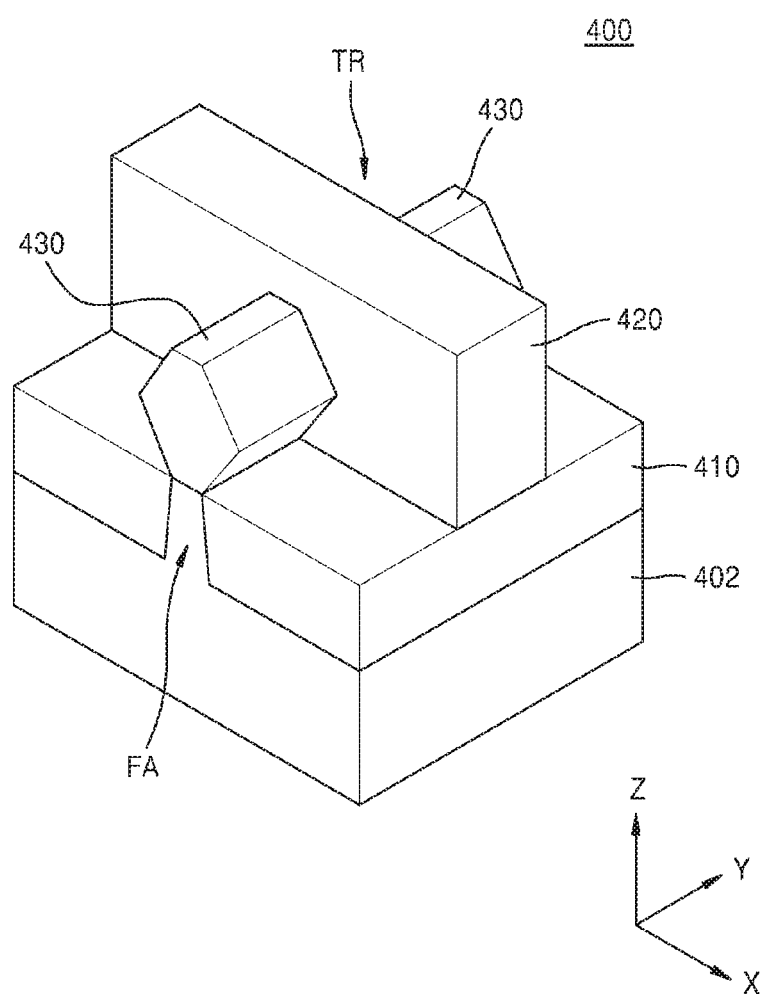
FIG. 10B is a perspective view of the IC device of FIG. 10B.
Figure 10C:
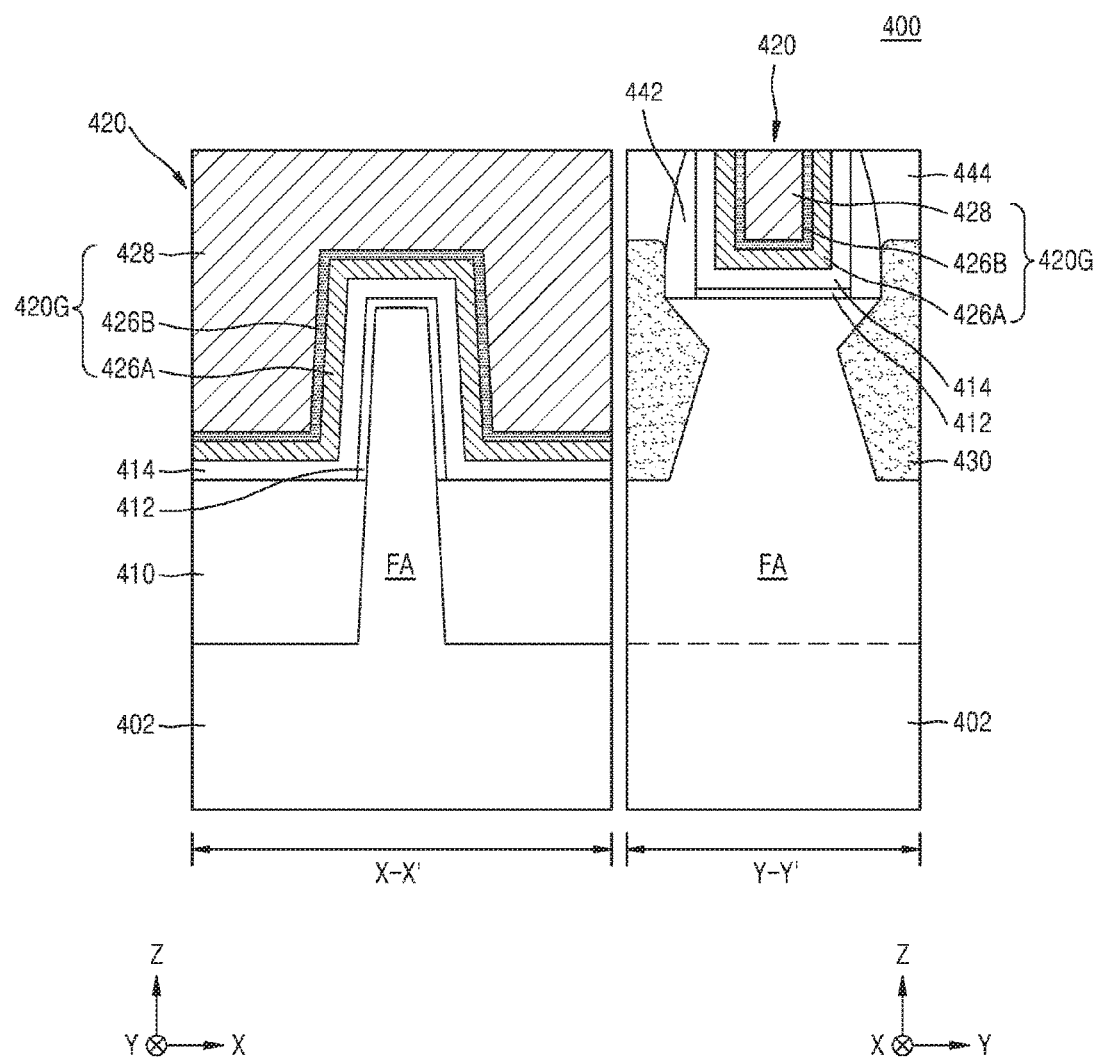
FIG. 10C is a cross-sectional view taken along lines X-X' and Y-Y' of FIG. 10A.

Referring to FIGS. 10A to 10C, an IC device 400 may include a fin-type active region FA, which may protrude from a substrate 402.

Since the substrate 402 is substantially the same as the substrate 310 described with reference to FIG. 9A, detailed descriptions thereof are omitted here.

The substrate 402 may include a Group III-V material or a Group IV material and be used as a material for a channel of a high-power high-speed transistor. When an NMOS transistor is formed on the substrate 402, the substrate 402 may include any one of Group III-V materials. For example, the substrate 402 may include GaAs. When a PMOS transistor is formed on the substrate 402, the substrate 402 may include a semiconductor material (e.g., germanium) having a higher hole mobility than a silicon substrate.

The fin-type active region FA may extend in one direction (refer to Y direction in FIGS. 10A and 10B). A device isolation layer 410 may be formed on the substrate 402 to cover a lower sidewall of the fin-type active region FA. The fin-type active region FA may protrude as a fin type on the device isolation layer 410. In some example embodiments, the device isolation layer 410 may include a silicon oxide layer, a silicon nitride layer, a silicon oxynitride layer, or a combination thereof, but example embodiments of the inventive concepts are not limited thereto.

A gate structure 420 may be formed on the substrate 410 and extend over the fin-type active region FA in a direction (X direction) that intersects an extension direction of the fin-type active region FA. One pair of source and drain regions 430 may be formed in the fin-type active region FA on both sides of the gate structure 420.

The one pair of source and drain regions 430 may include a semiconductor layer that is epitaxially grown from the fin-type active region FA. Each of the one pair of source and drain regions 430 may have an embedded silicon germanium (SiGe) structure including a plurality of epitaxially grown silicon germanium layers, an epitaxially grown silicon layer, or an epitaxially grown silicon carbide (SiC) layer. FIG. 10B illustrates a case in which the one pair of source and drain regions 430 have a specific shape, but a sectional shape of each of the one pair of source and drain regions 430 is not limited to that shown in FIG. 10B and have various shapes. For example, the one pair of source and drain regions 430 may have various sectional shapes, such as a circular sectional shape, an elliptical sectional shape, or a polygonal sectional shape.

A MOS transistor TR may be formed at an intersections between the fin-type active region FA and the gate structure 420. The MOS transistor TR may include a three-dimensional (3D) MOS transistor having channels formed on a top surface and two side surfaces of the fin-type active region FA. The MOS transistor TR may constitute an NMOS transistor or a PMOS transistor.

As shown in FIG. 10C, the gate structure 420 may include an interface layer 412, a high-k dielectric layer 414, a first metal-containing layer 426A, a second metal-containing layer 426B, and a gap-fill metal layer 428, which may be sequentially formed on the surface of the fin-type active region FA. Among the gate structure 420, the first metal-containing layer 426A, the second metal-containing layer 426B, and the gap-fill metal layer 428 may constitute a gate electrode 420G.

Insulating spacers 442 may be formed on both side surfaces of the gate structure 420. An interlayer insulating layer 444 may be formed opposite to the gate structure 420 across the insulating spacers 442 to cover the insulating spacers 442.

The interface layer 412 may be formed on the surface of the fin-type active region FA. The interface layer 412 may include an insulating material, such as an oxide layer, a nitride layer, or an oxynitride layer. The interface layer 412 may constitute a gate insulating layer along with the high-k dielectric layer 414.

The high-k dielectric layer 414 may include a material having a higher dielectric constant than a silicon oxide layer. For example, the high-k dielectric layer 414 may have a dielectric constant of about 10 to about 25. The high-k dielectric layer 414 may include a material selected from the group consisting of zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but a material forming the high-k dielectric layer 414 is not limited thereto.

The high-k dielectric layer 414 may be formed by using an ALD process. The high-k dielectric layer 414 may be formed by the method of forming the material layer as described with reference to FIG. 1 and 2 or 5.

In some example embodiments, the first metal-containing layer 426A may include titanium nitride, tantalum nitride, titanium oxynitride, or tantalum oxynitride. For example, the first metal-containing layer 426A may include TiN, TaN, TiAlN, TaAlN, TiSiN, or a combination thereof. The first metal-containing layer 426A may be formed by using various deposition methods, such as an ALD process, a CVD process, or a PVD process.

In some example embodiments, the second metal-containing layer 426B may include an N-type metal-containing layer required for an NMOS transistor including an aluminum compound containing titanium or tantalum. For example, the second metal-containing layer 426B may include TiAlC, TiAlN, TiAlCN, TiAl, TaAlC, TaAlN, TaAlCN, TaAl, or a combination thereof.

In some example embodiments, the second metal-containing layer 426B may include a p-type metal-containing layer required for a PMOS transistor. For example, the second metal-containing layer 426B may include at least one of Mo, Pd, Ru, Pt, TiN, WN, TaN, Ir, TaC, RuN, and MoN.

The second metal-containing layer 426B may include a single layer or a multilayered structure.

The second metal-containing layer 426B may serve to control a work function of a gate structure 120 along with the first metal-containing layer 426A. A threshold voltage of the gate structure 120 may be controlled by adjusting work functions of the first metal-containing layer 426A and the second metal-containing layer 426B. In some example embodiments, any one of the first metal-containing layer 426A and the second metal-containing layer 426B may be omitted.

When the gate structure 420 is formed by a replacement metal gate (RMG) process, the gap-fill metal layer 428 may be formed to fill the remaining gate space on the second metal-containing layer 426B. After the second metal-containing layer 426B is formed, when there is no remaining gate space on the second metal-containing layer 426B, the gap-fill metal layer 428 may not be formed on the second metal-containing layer 426B but omitted.

The gap-fill metal layer 428 may include a material selected from the group consisting of tungsten (W), a metal nitride (e.g., TiN and TaN), aluminum (Al), a metal carbide, a metal silicide, a metal aluminum carbide, a metal aluminum nitride, and a metal silicon nitride.

In the method of manufacturing the IC device 400 as described with reference to FIGS. 10A to 10C, the high-k dielectric layer 414 may be formed by using a method of forming a material layer according to example embodiments. That is, the formation of the high-k dielectric layer 414 may include forming an adsorption layer of an ether-based modifier and an adsorption layer of a source material on the fin-type active region FA in which the interface layer 412 is formed, and supplying a reaction material, such as an oxidizer or a reducer, to form a material containing central atoms.

The method of manufacturing the IC device including the FinFET including the 3D channel has been described with reference to FIGS. 10A to 10C, but example embodiments of the inventive concepts are not limited thereto. For example, it will be clearly understood by one of ordinary skill in the art that methods of manufacturing IC devices including planar MOSFETs having characteristics according to example embodiments may be provided by making various changes in form and details to the above-described example embodiments within the spirit and scope of the inventive concepts.

Figure 11:
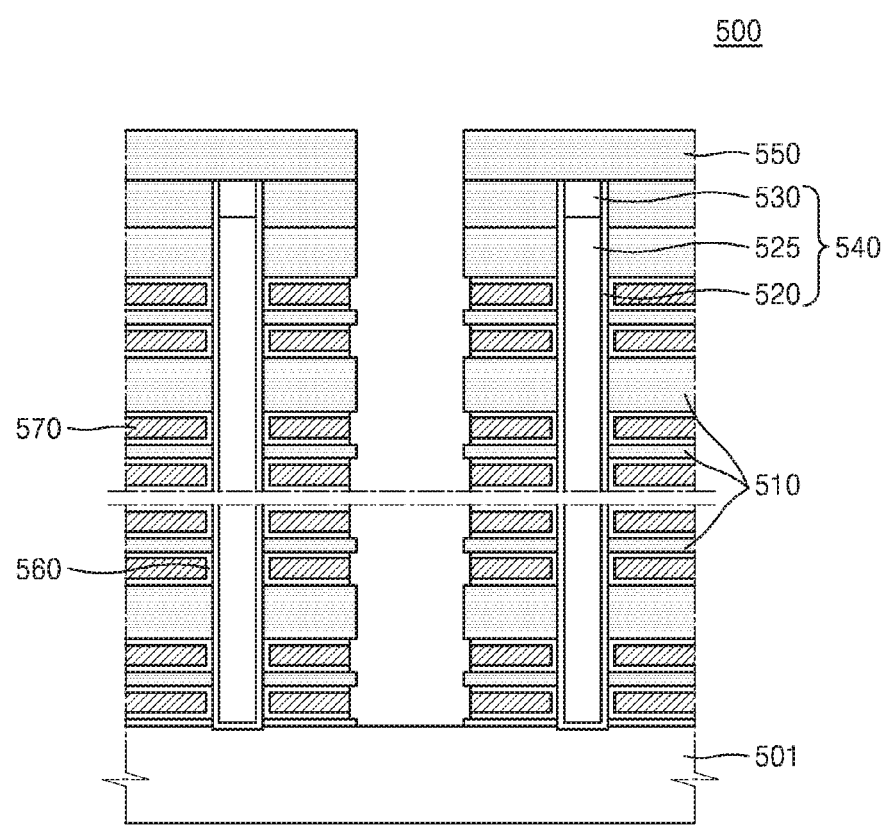
FIG. 11 is a cross-sectional view of another example of a semiconductor device manufactured by a method of manufacturing a semiconductor device, according to some example embodiments.

FIG. 11 is a cross-sectional view of another example of a semiconductor device formed by a method of manufacturing a semiconductor device according to some example embodiments.

Referring to FIG. 11, an interlayer insulating layers 510 may be vertically stacked on a semiconductor substrate 501. Conductive patterns 570 may be interposed between the interlayer insulating layers 510.

Vertical structures 540 may penetrate the conductive patterns 570 and the interlayer insulating layers 510. Each of the vertical structures 540 may include a core pattern 525, a pad pattern 530, and an outer pattern 520 that surrounds a side surface of the core pattern 525 and extends on a side surface of the pad pattern 530.

The core pattern 525 may include an insulating material, such as silicon oxide. When the core pattern 525 include a dielectric material formed by using an ALD process, the core pattern 525 may be formed by a method of forming a material layer according to example embodiments.

The pad pattern 530 may be located on the core pattern 525 at a higher level than an uppermost conductive pattern of the conductive patterns 570. The pad pattern 530 may include a conductive material, such as doped poly-Si.

The outer pattern 520 may include a semiconductor pattern that may serve as a channel of a transistor. For example, the outer pattern 520 may include a semiconductor material, such as silicon. A portion of the outer pattern 520, which is near to the conductive patterns 570, may include a dielectric material. The dielectric material may include a material (e.g., silicon oxide) that may serve as a tunnel oxide layer of a transistor. The dielectric material may include a material (e.g., silicon nitride or a high-k dielectric material) capable of storing information of a flash memory device. The dielectric material may be formed by a method of forming a material layer according to example embodiments.

Meanwhile, the conductive patterns 570 may include a metal nitride layer and/or a metal layer. For example, each of the conductive patterns 570 may include a metal layer and a metal nitride layer interposed between the metal layer and the interlayer insulating layers 510. Also, the metal nitride layer may extend between the metal layer and the vertical structure 540. The conductive patterns 570 may be formed by a method of forming a material layer according to example embodiments.

A capping insulating layer 550 may be provided to cover the interlayer insulating layer 510 and the vertical structure 540.

Figure 12:
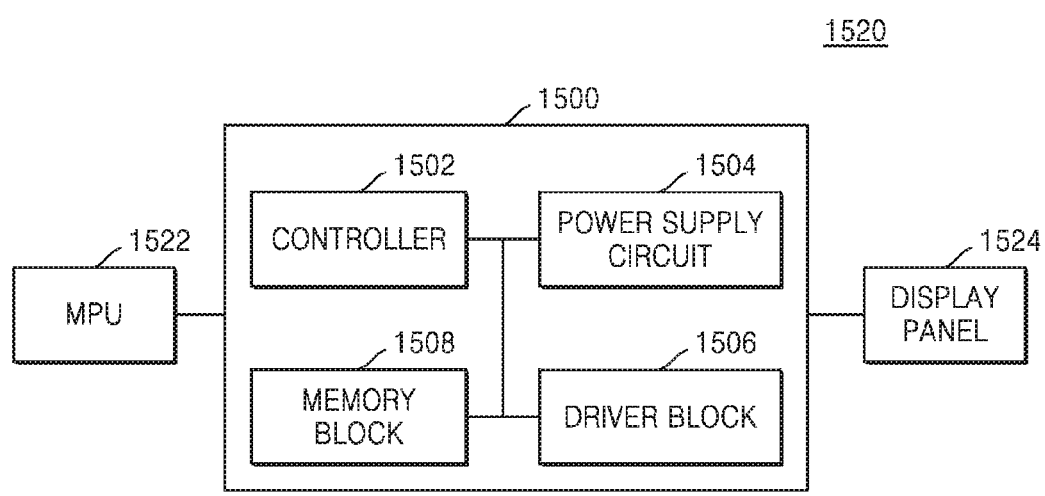
FIG. 12 is a schematic block diagram of a display device including a display driver integrated circuit (DDI), according to some example embodiments.

FIG. 12 is a schematic block diagram of a display device including a display driver integrated circuit (DDI) according to some example embodiments.

Referring to FIG. 12, a DDI 1500 may include a controller 1502, a power supply circuit 1504, a driver block 1506, and a memory block 1508. The controller 1502 may receive a command applied from a main processing unit (MPU) 1522, decode the command, and control respective blocks of the DDI 1500 to perform an operation in response to the command. The power supply circuit 1504 may generate a driving voltage in response to the control of the controller 1502. The driver block 1506 may drive the display panel 1524 by using the driving voltage generated by the power supply circuit 1504 in response to the control of the controller 1502. The display panel 1524 may be a liquid crystal display (LCD) panel, a plasma display panel (PDP), or an organic light emitting diode (OLED) display panel. The memory block 1508 may temporarily store the command input to the controller 1502 or control signals output by the controller 1502 or store required data. The memory block 1508 may include a memory, such as RAM or ROM. At least one of the power supply circuit 1504 and the driver block 1506 may include a thin layer formed by the method of forming the material layer as described with reference to FIGS. 9A to 11.

Figure 13:
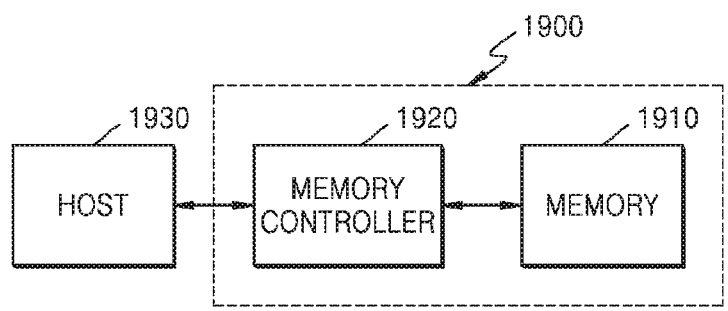
FIG. 13 is a block diagram of an electronic system according to some example embodiments.

FIG. 13 is a block diagram of an electronic system according to some example embodiments.

Referring to FIG. 13, an electronic system 1900 may include a memory 1910 and a memory controller 1920. The memory controller 1920 may control the memory 1910 to read data from the memory 1910 and/or write data to the memory 1910 in response to a request of a host 1930. At least one of the memory 1910 and the memory controller 1920 may include a thin layer formed by the method of forming the material layer as described with reference to FIGS. 1 and 2 or 5 or the IC devices 300,400, and 500 manufactured by the methods described with reference to FIGS. 9A to 11.

Figure 14:
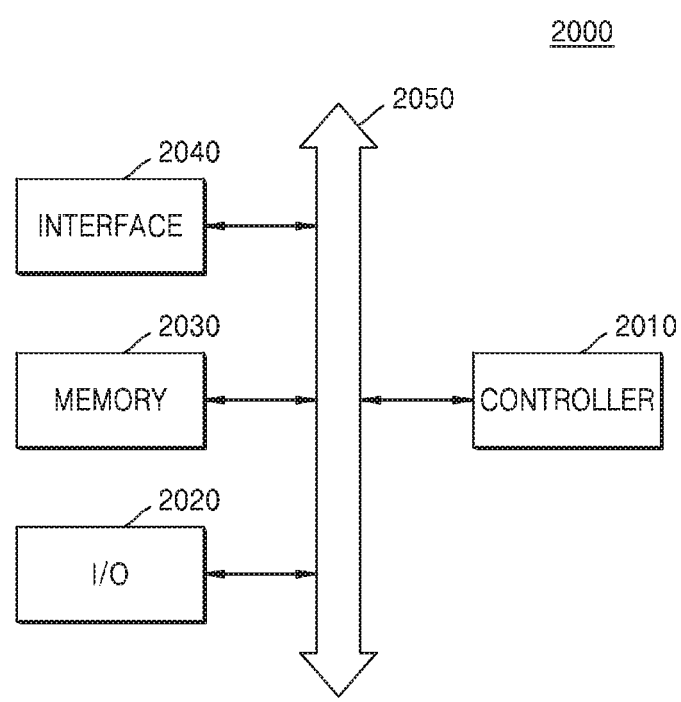
FIG. 14 is a block diagram of an electronic system according to some example embodiments.

FIG. 14 is a block diagram of an electronic system according to some example embodiments.

Referring to FIG. 14, an electronic system 2000 may include a controller 2010, and input/output (I/O) 2020, a memory 2030, and an interface 2040, which may be connected to one another via a bus 2050.

The controller 2010 may include at least one of a microprocessor (MP), a digital signal processor (DSP), or a processing device similar thereto. The I/O device 2020 may include at least one of a keypad, a keyboard, or a display device. The memory 2030 may be used to store commands executed by the controller 2010. For example, the memory 2030 may be used to store user data.

The electronic system 2000 may constitute a wireless communication device or a device capable of transmitting and/or receiving information in a wireless environment. In the electronic system 2000, the interface 2040 may include a wireless interface to transmit/receive data via a wireless communication network. The interface 2040 may include an antenna and/or a wireless transceiver. In some embodiments, the electronic system 2000 may be used for a communication interface protocol of a third-generation communication system, for example, code division multiple access (CDMA), global system for mobile communications (GSM), north American digital cellular (NADC), extended-time division multiple access (E-TDMA), and/or wide band code division multiple access (WCDMA). The electronic system 2000 may include a thin layer formed by the method of forming the material layer as described with reference to FIGS. 1 and 2 or 5 or the IC devices 300,400, and 500 manufactured by the methods described with reference to FIGS. 9A to 11.

While the inventive concepts have been particularly shown and described with reference to example embodiments thereof, it will be understood that various changes in form and details may be made therein without departing from the spirit and scope of the following claims.

What is claimed is:

1. A semiconductor manufacturing apparatus comprising:
    a reaction chamber that is configured for loading and unloading a substrate;
    a source material supply apparatus configured for supplying a source material to the reaction chamber, the source material being a precursor of a metal or a semimetal having a ligand;
    a modifier supply apparatus configured for supplying an ether-based modifier to the reaction chamber;
    a reaction material supply apparatus configured for supplying a reaction material to the reaction chamber; and
    a purge gas supply apparatus configured for supplying a purge gas to the reaction chamber,
    wherein the ether-based modifier is tetrahydrofuran (THF), and the modifier supply apparatus is configured for supplying the ether-based modifier before the supplying a source material or after the supplying a source material within one cycle.

2. The semiconductor manufacturing apparatus according to claim 1, wherein the reaction material is an oxidizer selected from the group consisting of $O_3$, $H_2O$, $O_2$, $NO_2$, NO, $N_2O$, $H_2O$, alcohol, a metal alkoxide, plasma $O_2$, remote plasma $O_2$, plasma $N_2O$, plasma $H_2O$, and a combination thereof.

3. The semiconductor manufacturing apparatus according to claim 1, wherein the source material supply apparatus comprises a vaporizer in which the source material is vaporized.

4. The semiconductor manufacturing apparatus according to claim 3, wherein a flow rate of the source material from the vaporizer to the reaction chamber is controlled by a flow rate control device interposed therebetween.

5. The semiconductor manufacturing apparatus according to claim 1, wherein the reaction material supply apparatus is configured to supply the reaction material to the reaction chamber while the source material supply apparatus does not supply the source material to the reaction chamber.

6. The semiconductor manufacturing apparatus according to claim 5, wherein the modifier supply apparatus is configured to supply the ether-based modifier to the reaction chamber after the supplying of the reaction material is terminated and before the supplying of the source material begins.

7. The semiconductor manufacturing apparatus according to claim 5, wherein the modifier supply apparatus is configured to supply the ether-based modifier to the reaction chamber after the supplying of the source material is terminated and before the supplying of the reaction material begins.

8. The semiconductor manufacturing apparatus according to claim 5, wherein the modifier supply apparatus is configured to supply the ether-based modifier to the reaction chamber while the source material is supplied to the reaction chamber by the source material supply apparatus.

9. The semiconductor manufacturing apparatus according to claim 5, wherein the modifier supply apparatus is configured to begin supplying the ether-based modifier to the reaction chamber after the source material supply apparatus begins supplying the source material to the reaction chamber, and the modifier supply apparatus is configured to stop supplying the ether-based modifier to the reaction chamber after the source material supply apparatus stops supplying the source material to the reaction chamber.

10. The semiconductor manufacturing apparatus according to claim 5, wherein the source material supply apparatus is configured to begin supplying the source material to the reaction chamber as soon as the modifier supply apparatus stops a first supplying the ether-based modifier to the reaction chamber in a cycle, and the modifier supply apparatus is configured to begin a second supplying the ether-based modifier to the reaction chamber again as soon as the source material supply apparatus stops supplying the source material to the reaction chamber in the cycle.

11. The semiconductor manufacturing apparatus according to claim 5, wherein the modifier supply apparatus is configured to supply the ether-based modifier to the reaction chamber while the reaction material is supplied to the reaction chamber by the reaction material supply apparatus.

12. The semiconductor manufacturing apparatus according to claim 5, wherein the modifier supply apparatus is configured to begin supplying the ether-based modifier to the reaction chamber before the reaction material supply apparatus begins supplying the reaction material to the reaction chamber, and the modifier supply apparatus is configured to stop supplying the ether-based modifier to the reaction chamber before the reaction material supply apparatus stops supplying the reaction material to the reaction chamber.

13. The semiconductor manufacturing apparatus according to claim 5, wherein the modifier supply apparatus is configured to begin supplying the ether-based modifier to the reaction chamber after the reaction material supply apparatus begins supplying the reaction material to the reaction chamber, and the modifier supply apparatus is configured to stop supplying the ether-based modifier to the reaction chamber after the reaction material supply apparatus stops supplying the reaction material to the reaction chamber.

14. The semiconductor manufacturing apparatus according to claim 5, wherein the modifier supply apparatus is configured to begin supplying the ether-based modifier to the reaction chamber before the reaction material supply apparatus begins supplying the reaction material to the reaction chamber, and the modifier supply apparatus is configured to stop supplying the ether-based modifier to the reaction chamber after the reaction material supply apparatus stops supplying the reaction material to the reaction chamber.

15. A semiconductor manufacturing apparatus comprising:
a reaction chamber that is configured for loading and unloading a substrate;
a source material supply apparatus configured for supplying a source material to the reaction chamber, the source material being a precursor of a metal or a semimetal having a ligand;
a modifier supply apparatus configured for supplying an ether-based modifier to the reaction chamber; and
a purge gas supply apparatus configured for supplying a purge gas to the reaction chamber,
wherein
the metal or semimetal of the precursor comprises at least one selected from the group consisting of zirconium (Zr), lithium (Li), beryllium Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), Francium (Fr), radium (Ra), actinium (Ac), and silicon (Si), the ether-based modifier is tetrahydrofuran (THF), and the modifier supply apparatus is configured for supplying the ether-based modifier before the supplying a source material or after the supplying a source material within one cycle.

16. The semiconductor manufacturing apparatus according to claim 15, further comprising a reaction material supply apparatus configured to supply a reaction material to the reaction chamber.

17. The semiconductor manufacturing apparatus according to claim 16, wherein the reaction material supply apparatus is configured to supply an oxidizer as the reaction material such that an oxide layer of the metal or semimetal is formed, the oxidizer being selected from the group consisting of $O_3$, $H_2O$, $O_2$, $NO_2$, NO, $N_2O$, $H_2O$, alcohol, a metal alkoxide, plasma $O_2$, remote plasma $O_2$, plasma $N_2O$, plasma $H_2O$, and a combination thereof.

18. A semiconductor manufacturing apparatus comprising:
- a reaction chamber that is configured for loading and unloading a substrate;
- a source material supply apparatus configured for supplying a source material to the reaction chamber, the source material being a precursor of a metal or a semimetal having a ligand;
- a modifier supply apparatus configured for supplying an ether-based modifier to the reaction chamber;
- a reaction material supply apparatus configured for supplying an oxidizer to the reaction chamber to form an oxide layer; and
- a purge gas supply apparatus configured for supplying a purge gas to the reaction chamber,
- wherein the ether-based modifier is tetrahydrofuran (THF), and the modifier supply apparatus is configured for supplying the ether-based modifier before the supplying a source material or after the supplying a source material within one cycle.

* * * * *